United States Patent
Erdogan et al.

(10) Patent No.: US 6,788,236 B2
(45) Date of Patent: Sep. 7, 2004

(54) METHOD AND SYSTEM FOR IMPLEMENTING A SIGMA DELTA ANALOG-TO-DIGITAL CONVERTER

(75) Inventors: Alper Tunga Erdogan, Kucukesat (TR); Chung-Li Lu, San Jose, CA (US); Bijit Halder, Santa Clara, CA (US)

(73) Assignee: GlobespanVirata, Inc., Red Bank, NJ (US)

( * ) Notice: Subject to any disclaimer, the term of this patent is extended or adjusted under 35 U.S.C. 154(b) by 0 days.

(21) Appl. No.: 10/321,509

(22) Filed: Dec. 18, 2002

(65) Prior Publication Data

US 2004/0021595 A1 Feb. 5, 2004

Related U.S. Application Data

(60) Provisional application No. 60/340,246, filed on Dec. 18, 2001.

(51) Int. Cl.[7] .............................. H03M 1/12; H03M 3/00
(52) U.S. Cl. ........................................ 341/155; 341/143
(58) Field of Search ................................ 341/143, 155; 708/313; 375/232, 233, 265

(56) References Cited

U.S. PATENT DOCUMENTS

| | | |
|---|---|---|
| 2,632,058 A | 3/1953 | Gray |
| 4,245,345 A | 1/1981 | Gitlin et al. |
| 4,285,061 A | 8/1981 | Ho |
| 4,347,615 A | 8/1982 | Ash |
| 4,416,015 A | 11/1983 | Gitlin |
| 4,606,027 A | 8/1986 | Otani |
| 4,890,298 A | 12/1989 | Galpin |
| 5,220,570 A | 6/1993 | Lou et al. |
| 5,333,149 A | 7/1994 | Vicard et al. |
| 5,457,705 A | 10/1995 | Todoroki |
| 5,502,736 A | 3/1996 | Tororoki |
| 5,509,021 A | 4/1996 | Todoroki |
| 5,590,065 A | * 12/1996 | Lin ............................ 708/313 |
| 5,598,434 A | 1/1997 | Kaku et al. |
| 5,636,244 A | 6/1997 | Goodson et al. |
| 5,751,615 A | * 5/1998 | Brown ........................ 708/313 |
| 5,751,734 A | 5/1998 | Choi et al. |
| 5,796,756 A | 8/1998 | Choi et al. |
| 5,838,729 A | 11/1998 | Hu et al. |
| 5,896,372 A | 4/1999 | Auerbauch et al. |

(List continued on next page.)

OTHER PUBLICATIONS

ITU Standard G.991.2, "Single Pair High Speed Digital Subscriber Line (SHDSL) Transceivers" Feb. 2001.

(List continued on next page.)

Primary Examiner—Jean Bruner Jeanglaude
(74) Attorney, Agent, or Firm—Hunton & Williams LLP

(57) ABSTRACT

An embodiment of the present invention is related to an analog-to-digital converter comprising a polyphase combiner comprising at least a first combiner filter and a second combiner filter for receiving a plurality of inputs and generating a combined signal. The analog-to-digital converter also comprises a multistage decimator structure for receiving the combined signal and generating a digital sigma-delta output, the multistage decimator structure comprising at least a first decimator comprising a first integrator filter; a first downsampling block and a first differentiator; and a second decimator comprising a second integrator filter; a second downsampling block and a second differentiator.

20 Claims, 24 Drawing Sheets

U.S. PATENT DOCUMENTS

| | | | |
|---|---|---|---|
| 5,928,378 A | | 7/1999 | Choi |
| 5,946,361 A | | 8/1999 | Araki et al. |
| 5,963,160 A | * | 10/1999 | Wilson et al. ............... 341/143 |
| 5,970,104 A | | 10/1999 | Zhong et al. |
| 5,986,598 A | | 11/1999 | Mittel |
| 5,995,562 A | | 11/1999 | Koizumi |
| 6,038,251 A | | 3/2000 | Chen |
| 6,055,268 A | | 4/2000 | Timm et al. |
| 6,069,879 A | | 5/2000 | Chatter |
| 6,112,232 A | | 8/2000 | Shahar et al. |
| 6,232,901 B1 | | 5/2001 | Abbey |
| 6,232,902 B1 | | 5/2001 | Wada |
| 6,292,121 B1 | * | 9/2001 | Cake et al. ................. 341/143 |
| 6,292,124 B1 | | 9/2001 | Hanada et al. |
| 6,344,812 B1 | | 2/2002 | Takeda et al. |
| 6,369,730 B1 | | 4/2002 | Blanken et al. |
| 6,388,601 B1 | | 5/2002 | De Gouy et al. |
| 6,424,279 B1 | | 7/2002 | Kim et al. |
| 6,424,280 B2 | | 7/2002 | Sadkowski |
| 6,441,761 B1 | | 8/2002 | Viswanathan |
| 6,445,734 B1 | | 9/2002 | Chen et al. |
| 6,452,521 B1 | | 9/2002 | Wang et al. |
| 6,456,217 B1 | | 9/2002 | Esaki |
| 6,456,219 B1 | | 9/2002 | Schreiber et al. |
| 6,470,365 B1 | * | 10/2002 | Rahman et al. ............. 708/313 |
| 6,483,449 B2 | | 11/2002 | Gandolfi et al. |
| 6,489,913 B1 | | 12/2002 | Hansen et al. |
| 6,496,128 B2 | | 12/2002 | Wiesbauer et al. |
| 6,498,573 B2 | | 12/2002 | Laaser |
| 6,498,819 B1 | | 12/2002 | Martin |
| 6,515,605 B2 | | 2/2003 | Panasik et al. |
| 6,515,607 B2 | | 2/2003 | Liu et al. |
| 6,697,003 B1 | * | 2/2004 | Chen .......................... 341/143 |

OTHER PUBLICATIONS

David Falconer, et al., "Application of Fast Kalman Estimation to Adaptive Equalization," IEEE Trans. on Comm., COM–26, No. 10, pp. 1439–1446, Oct. 1978.

Richard D. Gitlin, et al., "Data Communications Principles," Chapter B, p. 591, 1992.

J. Quilichi, "HDSL2 Drives Down The Deployment Cost For T1 Service," http://www.chipcenter.com/networking/technote004.html, pp. 1–7, Mar. 2002.

M. Rode, "Draft For HDSL2 Standard", Committee T1—Telecommunications T1E1.4, pp. 1–15, Nov./Dec. 1998.

M. Tu, " A 512–State PAM TCM Code for HDSL2", T1E1.4 Standards Project (HDSL2), pp. 1–7, Sep. 1997.

P. Jackson, et al., "Literature Survey on HDSL2 Modern Modeling and Simulation", EE 382C: Embedded Software Systems, pp. 1–10, Mar. 1999.

J. Quilichi, "An HDSL2 Printer", pp. 1–18, 2002.

G.A . Zimmerman, "HDSL2 Tutorial: Spectral Compatibility and Real–World Performance Advances", PairGain Technologies pp. 1–12, Jun. 1998.

* cited by examiner

| SYSTEM TYPE | DATA BITS PER SYMBOL | CODED BITS PER SYMBOL | CONSTELLATION SIZE | DATA RATE WITH 1.5 Mb PSD | DATA RATE WITH 2.0 Mb PSD | DATA RATE WITH 2.312 Mb PSD |
|---|---|---|---|---|---|---|
| SHDSL | 3 | 4 | 16-PAM | 1.5 Mbps | 2.0 Mbps | 2.312 Mbps |
| RE-SHDSL | M=4 | 5 | 32-PAM | 2.0 Mbps | 2.67 Mbps | 3.08 Mbps |
| RE-SHDSL | M=5 | 6 | 64-PAM | 2.5 Mbps | 3.33 Mbps | 3.85 Mbps |
| RE-SHDSL | M=6 | 7 | 128-PAM | 3.0 Mbps | 4.0 Mbps | 4.62 Mbps |
| RE-SHDSL | M=7 | 8 | 256-PAM | 3.5 Mbps | 4.67 Mbps | 5.39 Mbps |

FIG. 1a

| MAPPER-IN ($x_7:x_1$) | OUTPUT LEVEL | OUTPUT (HEX) | MAPPER-IN ($x_7:x_1$) | OUTPUT LEVEL | OUTPUT (HEX) |
|---|---|---|---|---|---|
| 0000000 | -127/128 | 8100 | 0000001 | -125/128 | 8300 |
| 0000010 | -123/128 | 8500 | 0000011 | -121/128 | 8700 |
| 0000100 | -119/128 | 8900 | 0000101 | -117/128 | 8B00 |
| 0000110 | -115/128 | 8D00 | 0000111 | -113/128 | 8F00 |
| 0001000 | -111/128 | 9100 | 0001001 | -109/128 | 9300 |
| 0001010 | -107/128 | 9500 | 0001011 | -105/128 | 9700 |
| 0001100 | -103/128 | 9900 | 0001101 | -101/128 | 9B00 |
| 0001110 | -99/128 | 9D00 | 0001111 | -97/128 | 9F00 |
| 0010000 | -95/128 | A100 | 0010001 | -93/128 | A300 |
| 0010010 | -91/128 | A500 | 0010011 | -89/128 | A700 |
| 0010100 | -87/128 | A900 | 0010101 | -85/128 | AB00 |
| 0010110 | -83/128 | AD00 | 0010111 | -81/128 | AF00 |
| 0011000 | -79/128 | B100 | 0011001 | -77/128 | B300 |
| 0011010 | -75/128 | B500 | 0011011 | -73/128 | B700 |
| 0011100 | -71/128 | B900 | 0011101 | -69/128 | BB00 |
| 0011110 | -67/128 | BD00 | 0011111 | -65/128 | BF00 |
| 0100000 | -63/128 | C100 | 0100001 | -61/128 | C300 |
| 0100010 | -59/128 | C500 | 0100011 | -57/128 | C700 |
| 0100100 | -55/128 | C900 | 0100101 | -53/128 | CB00 |
| 0100110 | -51/128 | CD00 | 0100111 | -49/128 | CF00 |
| 0101000 | -47/128 | D100 | 0101001 | -45/128 | D300 |
| 0101010 | -43/128 | D500 | 0101011 | -41/128 | D700 |
| 0101100 | -39/128 | D900 | 0101101 | -37/128 | DB00 |
| 0101110 | -35/128 | DD00 | 0101111 | -33/128 | DF00 |
| 0110000 | -31/128 | E100 | 0110001 | -29/128 | E300 |
| 0110010 | -27/128 | E500 | 0110011 | -25/128 | E700 |
| 0110100 | -23/128 | E900 | 0110101 | -21/128 | EB00 |
| 0110110 | -19/128 | ED00 | 0110111 | -17/128 | EF00 |
| 0111000 | -15/128 | F100 | 0111001 | -13/128 | F300 |
| 0111010 | -11/128 | F500 | 0111011 | -9/128 | F700 |
| 0111100 | -7/128 | F900 | 0111101 | -5/128 | FB00 |
| 0111110 | -3/128 | FD00 | 0111111 | -1/128 | FF00 |

FIG. 1b

| MAPPER-IN ($x_7:x_1$) | OUTPUT LEVEL | OUTPUT (HEX) | MAPPER-IN ($x_7:x_1$) | OUTPUT LEVEL | OUTPUT (HEX) |
|---|---|---|---|---|---|
| 1000000 | 1/128 | 0100 | 1000001 | 3/128 | 0300 |
| 1000010 | 5/128 | 0500 | 1000011 | 7/128 | 0700 |
| 1000100 | 9/128 | 0900 | 1000101 | 11/128 | 0B00 |
| 1000110 | 13/128 | 0D00 | 1000111 | 15/128 | 0F00 |
| 1001000 | 17/128 | 1100 | 1001001 | 19/128 | 1300 |
| 1001010 | 21/128 | 1500 | 1001011 | 23/128 | 1700 |
| 1001100 | 25/128 | 1900 | 1001101 | 27/128 | 1B00 |
| 1001110 | 29/128 | 1D00 | 1001111 | 31/128 | 1F00 |
| 1010000 | 33/128 | 2100 | 1010001 | 35/128 | 2300 |
| 1010010 | 37/128 | 2500 | 1010011 | 39/128 | 2700 |
| 1010100 | 41/128 | 2900 | 1010101 | 43/128 | 2B00 |
| 1010110 | 45/128 | 2D00 | 1010111 | 47/128 | 2F00 |
| 1011000 | 49/128 | 3100 | 1011001 | 51/128 | 3300 |
| 1011010 | 53/128 | 3500 | 1011011 | 55/128 | 3700 |
| 1011100 | 57/128 | 3900 | 1011101 | 59/128 | 3B00 |
| 1011110 | 61/128 | 3D00 | 1011111 | 63/128 | 3F00 |
| 1100000 | 65/128 | 4100 | 1100001 | 67/128 | 4300 |
| 1100010 | 69/128 | 4500 | 1100011 | 71/128 | 4700 |
| 1100100 | 73/128 | 4900 | 1100101 | 75/128 | 4B00 |
| 1100110 | 77/128 | 4D00 | 1100111 | 79/128 | 4F00 |
| 1101000 | 81/128 | 5100 | 1101001 | 83/128 | 5300 |
| 1101010 | 85/128 | 5500 | 1101011 | 87/128 | 5700 |
| 1101100 | 89/128 | 5900 | 1101101 | 91/128 | 5B00 |
| 1101110 | 93/128 | 5D00 | 1101111 | 95/128 | 5F00 |
| 1110000 | 97/128 | 6100 | 1110001 | 99/128 | 6300 |
| 1110010 | 101/128 | 6500 | 1110011 | 103/128 | 6700 |
| 1110100 | 105/128 | 6900 | 1110101 | 107/128 | 6B00 |
| 1110110 | 109/128 | 6D00 | 1110111 | 111/128 | 6F00 |
| 1111000 | 113/128 | 7100 | 1111001 | 115/128 | 7300 |
| 1111010 | 117/128 | 7500 | 1111011 | 119/128 | 7700 |
| 1111100 | 121/128 | 7900 | 1111101 | 123/128 | 7B00 |
| 1111110 | 125/128 | 7D00 | 1111111 | 127/128 | 7F00 |

FIG. 1c

| $b_n$ | 2 | 3 | 4 | 5 | ... | EVEN NUMBER | ODD NUMBER (>3) |
|---|---|---|---|---|---|---|---|
| $e_n(b_n)$ | $3\alpha_n$ | $9\alpha_n$ | $15\alpha_n$ | $30\alpha_n$ | ... | $(2^{b_n}-1)\alpha_n$ | $(2^{b_n} \times 31/32 - 1)\alpha_n$ |

FIG. 14

METHOD AND SYSTEM FOR IMPLEMENTING A SIGMA DELTA ANALOG-TO-DIGITAL CONVERTER

CROSS REFERENCE TO RELATED APPLICATIONS

This application claims priority from provisional application Serial No. 60/340,246, filed Dec. 18, 2001, which is incorporated by reference.

FIELD OF THE INVENTION

The present invention relates generally to analog-to-digital converters, more particularly, an efficient polyphase implementation of sigma delta analog-to-digital converter.

BACKGROUND OF THE INVENTION

The advent of the Internet and the widespread popularity of personal computers have created an unprecedented demand for high bandwidth networks. Generally, Internet applications, from simple email to real time video conferencing, from web surfing to interactive movies, from interactive games to virtual TV stations, from online trading to online gambling, demand a higher bandwidth communication network. A fundamental challenge for the communication industry is to provide a reliable and affordable high bandwidth communication link to all types of Internet users. Various competing wire-line, wireless, and optical broadband technologies are deployed to partially meet the ever-increasing demand for higher bandwidth. The fastest growing broadband technology is the Digital Subscriber Line (DSL) technology, which provides a high bandwidth always-on connection over standard twisted pair copper media of the conventional telephone network. Among other wire-line media, coaxial cables are capable of providing always-on connections, however, its presence is insignificant compared to millions and millions of wired telephone customers who are connected by a twisted pair of copper wires. Other technologies, such as satellite, wireless, and optical, either provide limited coverage, limited bandwidth, or are too expensive for deployment to individual customers. As a result, DSL technology is uniquely positioned to provide the broadband link between individual customer premise and the central office, the so-called last-mile of the high-bandwidth communication network.

DSL is the fastest growing among emerging broadband technologies for very good reasons. First of all, DSL utilizes the existing copper wire network infrastructure. Secondly, compared to the voice modems, such as V.34 and V.90, used in most personal computers that provide up to 56 kbps dial-up connection, DSL provides a high bandwidth always-on connection with typical connection speeds from 384 kbps to 6 Mbps. Moreover, DSL is affordable with easy installation, simple turn-up, and high service reliability. The successful deployment of DSL is capable of providing digital broadband connection to anyone with an analog telephone line.

DSL services have been standardized over time by regional organizations such as, American National Standard Institute (ANSI), European Telecommunication Standard Institute (ETSI), and by world telecommunication organization International Telecommunication Union (ITU). These DSL standards define data communication protocols to connect customer premise equipment (CPE) to the central office (CO) and to provide connections to various networks, such as DSL service providers, virtual private networks (VPN), or the Internet. Various forms of digital data (e.g., voice, video, and data) can be transported using DSL technology. For transport of voice, DSL equipment is connected to the public switched telephone network (PSTN). For transport of video and data, DSL equipment uses the Internet via an Internet service provider (ISP). Voice over DSL (VoDSL) is capable of providing computer-to-computer, computer-to-telephone, and telephone-to-telephone voice services using an integrated access device (IAD). Video over DSL includes transport of MPEG-1 or MPEG-2 files, video conferencing using Internet Protocol (IP) standard such as ITU H.323, WebCam, and video mail. In addition, DSL supports simple data transport, e.g., bearer services, for virtual private network (VPN), leased data line such as T1 and E1, Point-to-Point Protocol (PPP), Asynchronous transfer mode (ATM), and Internet Protocol (IP).

Like other communication technologies, DSL has gone though a major evolution over the last decade and a collection of technologies, commonly referred to as xDSL, are developed under the umbrella of DSL. One type of subscriber loop digital transmission technology involves an integrated services digital network (ISDN), which has replaced a significant portion of the analog phone lines in Europe and Japan. ISDN offers integrated voice and data services and connection speed up to 144 kbps. Due to the high cost of deployment, an alternative solution called integrated digital loop carrier (IDLC) has been deployed in United States. However, resulting data rates were considered inadequate for individual customers. As a result, advanced DSL technologies were developed, which include HDSL, SDSL, ADSL, HDSL2, SHDSL, and VDSL, all of which are capable of connection speed in excess of 1 Mbps. These advanced DSL technologies were developed to address different needs and application demands, while serving different market segments. For example, SHDSL is a symmetric service designed for long reach office applications with connection speed of 1.5 Mbps, whereas, VDSL is designed to provide a very high-speed asymmetric service for a short-range applications.

SHDSL is a wire line Digital Subscriber Line (DSL) transmission technology that is designed to accommodate the need for higher data rates in telecommunication access networks. In particular, SHDSL supports duplex transmission of symmetric data rates over mixed gauge two-wire twisted metallic pairs, as described in the International Telecommunication Union (ITU) standard G.992.1— "Asymmetric Digital Subscriber Line (ADSL) Transceivers", the body of which is incorporated herein by reference.

These and other drawbacks exist with current technologies.

SUMMARY OF THE INVENTION

Aspects of the present invention overcome the problems noted above, and realize additional advantages.

According to yet another aspect of an embodiment of the present invention, a polyphase combiner and sigma-delta decimator block structure is provided. An implementation of the structure is enabled by an effective decoupling of a polyphase Infinite Impulse Response (IIR) structure into a cascade of a polyphase Finite Impulse Response (FIR) bank and a single phase IIR filter. An embodiment of the present invention enables a reduction in hardware implementation by reducing timing requirements for filtering and power consumption through the use of a lower clock rate. An embodiment of the present invention provides a low complexity/low power consumption implementation of the combiner and decimator blocks through the use of a polyphase structure.

According to an embodiment of the present invention, an analog-to-digital converter comprises a polyphase combiner comprising at least a first combiner filter and a second combiner filter for receiving a plurality of inputs and generating a combined signal; and a multistage decimator structure for receiving the combined signal and generating a digital sigma-delta output, the multistage decimator structure comprising at least a first decimator comprising a first integrator filter; a first downsampling block and a first differentiator; and a second decimator comprising a second integrator filter; a second downsampling block and a second differentiator.

In accordance with other aspects of this exemplary embodiment, the first combiner filter comprises a plurality of filters for receiving a plurality of input sequences and for generating a plurality of outputs; an adder for summing the plurality of outputs and for generating a first sum; and a first filter for receiving the first sum and for generating a first filtered output; the first filter comprises first filter coefficients defined as $\{f1_k; k \in \{0, \ldots, L_{F1} - 1\}\}$ where $L_{F1} = \begin{cases} \frac{K+1}{2} & \text{when } K \text{ is odd} \\ \frac{K}{2} + 1 & \text{when } K \text{ is even} \end{cases}$ and $f1_k = \binom{n}{2k}$ where $k \in \{0, \ldots, L_{F1}-1\}$; the input sequences comprises at least an even sub-sample and an odd sub-sample; the second combiner filter comprises a plurality of filters for receiving a plurality of input sequences and for generating a plurality of outputs; an adder for summing the plurality of outputs and for generating a second sum; and a second filter for receiving the second sum and for generating a second filtered output; the second filter comprises second filter coefficients defined as $\{f2_k; k \in \{0, \ldots, L_{F2}-1\}\}$ where $L_{F2} = \begin{cases} \frac{K+1}{2} & \text{when } K \text{ is odd} \\ \frac{K}{2} & \text{when } K \text{ is even} \end{cases}$ and $f2_k = \binom{n}{2k+1}$  $k \in \{0, \ldots, L_{F2} - 1\}$;

the input sequences comprises at least an even sub-sample and an odd sub-sample; a combiner adder for adding the first filtered output of the first filter and the second filtered output of the second filter; the first integrator filter comprises a $K^{th}$ order integrator filter comprising a cascade of K integrators; the first downsampling block having a first subsampling factor; and the first differentiator comprises a $K^{th}$ order differentiator comprising a cascade of K differentiators; where K is an integer greater than 1; and the second integrator filter comprises a $K^{th}$ order integrator filter comprising a cascade of K integrators; the second downsampling block having a second subsampling factor; and the second differentiator comprises a $K^{th}$ order differentiator comprising a cascade of K differentiators where K is an integer greater than 1.

According to another embodiment of the present invention, a method for implementing an analog-to-digital converter, comprises the steps of receiving a plurality of inputs by a first filter and a second filter; generating a combined signal in response to the plurality of inputs; receiving the combined signal; generating a digital sigma-delta output in response to the combined signal, wherein the digital sigma-delta output is generated by at least a first decimator comprising a first integrator filter; a first downsampling block and a first differentiator; and a second decimator comprising a second integrator filter; a second downsampling block and a second differentiator.

The accompanying drawings, which are incorporated in and constitute a part of this specification, illustrate various embodiments of the invention and, together with the description, serve to explain the principles of the invention.

BRIEF DESCRIPTION OF THE DRAWINGS

The present invention can be understood more completely by reading the following Detailed Description of the Invention, in conjunction with the accompanying drawings, in which:

FIG. 1a is a table illustrating enhanced data rates of RE-SHDSL as a function of number of data bits per symbol, according to an embodiment of the present invention.

FIG. 1b is a table illustrating a mapper definition, according to an embodiment of an aspect of the present invention.

FIG. 1c is a table illustrating a mapper definition, according to an embodiment of an aspect of the present invention.

FIG. 14 illustrates a table of number of bits and required power levels for incorporation into the bit loading algorithm, according to an embodiment of the present invention.

DETAILED DESCRIPTION OF THE INVENTION

Figure 2:
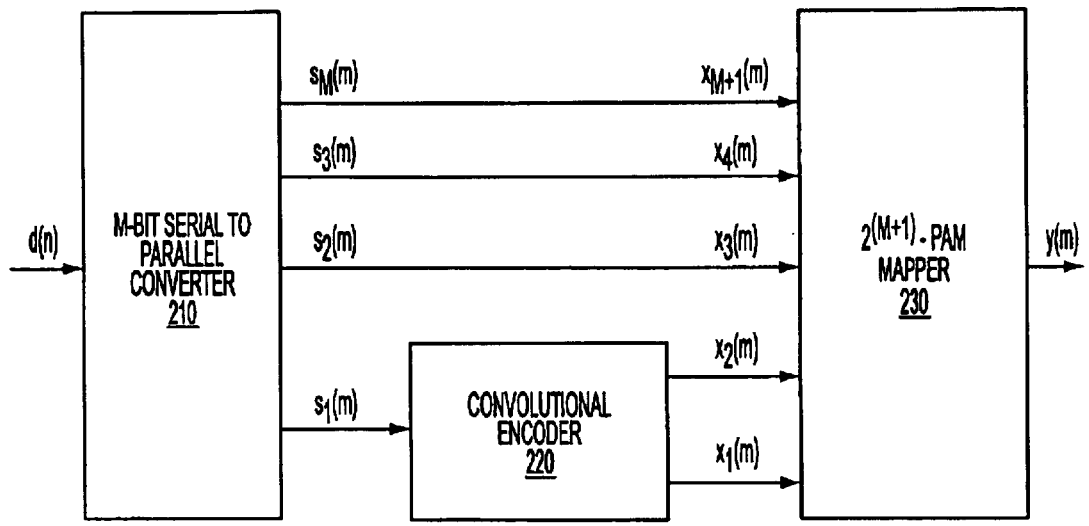
FIG. 2 illustrates a block diagram of TCM encoder for RE-G.SHDSL, according to an embodiment of an aspect of the present invention.

The following description is intended to convey a thorough understanding of the invention by providing a number of specific embodiments and details involving compliancy testing applications. It is understood, however, that the invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending upon specific design and other needs.

The International Telecommunications Union (ITU) has adopted a standard for Single-pair High-speed Digital Subscriber Line (SHDSL) technology to address the need for higher data rates in telecommunication access networks. The ITU recommendations for SHDSL (e.g., G.992.1) mandate the support of a wide range of data rates from 192 kilo bits per second (kbps) to 2.312 mega bits per second (Mbps). There are applications, such as MDU/MTU, Ethernet and others, that may require or at least prefer a data rate beyond 2.312 Mbps. According to an aspect of an embodiment of the present invention, an efficient, easy to implement, and flexible method and system for increasing the data rate of the existing SHDSL transceivers is provided. The Rate-Enhanced (RE)-SHDSL of an embodiment of the present invention satisfies spectral compatibility requirements and is further transparent to other applications.

The RE-SHDSL of an embodiment of the present invention supports a variety of functions. RE-SHDSL is an efficient and easy to implement approach to increase the data rate of an existing SHDSL transceiver. Rate enhancement may be achieved by increasing the number of data bits per symbol thereby increasing signal constellations. The effective use of larger constellations is one difference between RE-SHDSL and SHDSL. The RE-SHDSL achieves a higher data rate without requiring additional transmit bandwidth or transmit power. The rate enhancement achieved by RE-SHDSL of an embodiment of the present invention is flexible compared to a four wire approach specified in the standard. As in SHDSL, RE-SHDSL may support a single pair wires. RE-SHDSL uses the same (or substantially similar) set of transmit masks as specified in SHDSL standard. As a result, there is no need for additional transmit masks. RE-SHDSL is compatible with four wire operations and may be used in a four wire mode (or other mode) to achieve an additional doubling of data rate. RE-SHDSL may be used for both region specific Annexes A and B of the ITU standard G.992.1 for SHDSL as well as other standards.

The RE-SHDSL system of an embodiment of the present invention does not require an additional pair of wires and provides a more flexible rate enhancement. Features of RE-SHDSL system include spectral compliance and transparency for successful deployment of any DSL as well as other technology. In other words, RE-SHDSL is fully compliant to spectral management requirements where the enhancements are transparent to other services deployed in the same binder, e.g., to any other service RE-SHDSL appears substantially the same as SHDSL. As a result, deployment of RE-SHDSL does not create additional crosstalk for other applications.

As specified in the ITU standard G.991.2, SHDSL transceivers may include a precoded system with Trellis Coded Pulse Amplitude Modulation (TC-PAM) line code. In particular, an encoder may be used to convert 3 data bits into 4 coded bits. The coded 4 bits may be converted into a symbol using a 16-PAM constellation mapper. For every 3 data bits, the SHDSL transceiver generates one symbol with a symbol rate $R_s$, which is one-third of the data rate $R_d$, e.g., $R_s = R_d/3$. The symbol rate is a system parameter that dictates the transmission bandwidth. Generally, the higher the symbol rate, the larger the required bandwidth. Hence, if the constellation size is fixed, a larger bandwidth may be used to support higher data rates. However, such an approach would violate spectral compatibility and would not be transparent to other applications.

In contrast to the SHDSL system where 3 data bits are used to form a symbol, RE-SHDSL of an embodiment of the present invention uses more then 3 data bits per symbol. The data rate may be increased by increasing a constellation size and allocating more bits per symbol while keeping the symbol rate fixed. Moreover, to simplify the transceiver design, the encoding scheme as described in SHDSL may be used with the exception that the number of uncoded bits are increased. An advantage of this approach is that there is no need to change signal processing blocks following the mapper. In other words, the change in number of bits per symbol and the consequent change in constellation size do not effect the signal processing operations that follow the mapper. In particular, the transmit filter and the transmit Power Spectral Density (PSD) remain identical (or substantially similar) to that of SHDSL.

With that in mind, M (>3) may represent the number of data bits used per symbol for RE-SHDSL, where the enhanced data rate $R_{ed}$ is given by $$R_{ed} = \frac{M}{3} R_d,$$

where $R_d$ represents the original data rate for SHDSL. Since M is larger than 3, the enhanced date rate $R_{ed}$ is larger than the original data rate $R_d$. The SHDSL system is capable of supporting data rates from 192 kbps up to 2.312 Mbps with an 8 kbps increment. For every supported data rate, there is a specific transmit mask defined in the standard G.992.1. The RE-SHDSL of an embodiment of the present invention uses the transmit mask corresponding to the particular SHDSL data rate from the specifications. As a result, RE-SHDSL is automatically spectrally compliant and transparent to other applications.

Typical exemplary values of M along with the corresponding enhanced date rates are shown in FIG. 1a. FIG. 1a is a table illustrating enhanced data rates of RE-SHDSL as a function of number of data bits per symbol according to an embodiment of the present invention. Column 110 provides a system type; column 112 provides data bits per symbol; column 114 provides coded bits per symbol; column 116 provides constellation size; column 118 provides data rate with 1.5 Mb PSD; column 120 provides data rate with 2.0 Mb PSD; and column 122 provides data rate with 2.312 Mb PSD. As shown in FIG. 1a, when M=4, a data rate of 3.08 Mbps may be achieved by implementing a constellation size of 32-PAM. The RE-SHDSL approach of an embodiment of the present invention is applicable to region specific Annexes A and B of the ITU standard G.992.1 for SHDSL, as well as other standards.

The frame structure of RE-SHDSL incorporates a payload size that is larger than that of SHDSL. In SHDSL standard, each payload block is defined as k bits long, where k=12 (i+8n) bits, and the corresponding payload rate is given by 64n+8i kbps. The parameters n and i are two integer defined by $3 \leq n \leq 36$ and $0 \leq i \leq 7$. For example, for n=36 and i=1, a payload rate is equal to 2.312 Mbps. For RE-SHDSL, the value of n is larger than 36. The exact range of n depends on the vale of M and is given by $3 \leq n \leq 12M$. For M=6 or double rate applications, the range of values for n is $3 \leq n \leq 72$.

FIG. 2 is a diagram of a Trellis Coded Modulation (TCM) Encoder, according to an embodiment of the present invention. For RE-SHDSL, more than 3 data bits are used to form a symbol y(m), as shown in FIG. 2. In this case, each M (>3) serial data bits, $\{d(n), d(n+1), d(n+2), \ldots, d(n+M-1)\}$ may be converted by converter 210 to an M bit parallel word $\{s_1(m), s_2(m), s_3(m), \ldots, s_M(m)\}$. The first bit $s_1(m)$ may be encoded using a convolutional encoder 220, such as a half rate convolutional encoder, to generate two encoded bits $x_1(m)$ and $x_2(m)$. The other M−1 bits $s_2(M), s_3(m), \ldots, s_M(M)$ may be essentially untouched and renamed $x_3(m), x_4(m), \ldots, x_{M+1}(m)$, as follows:

$$s_2(m) \rightarrow x_3(m)$$
$$s_3(m) \rightarrow x_4(m)$$
$$\vdots \qquad \vdots$$
$$s_M(m) \cdots x_{M+1}(m).$$

The M+1 bits $\{x_1(m), x_2(m), x_3(m), x_4(m) \ldots x_{M+1}(m)\}$ may then be used to form a symbol using a $2^{M+1}$-PAM constellation 230. Symbol to bit error may be minimized (e.g., by a Gray Code or other code) to simplify the decoder design where the bit labeled $x_1(m)$ represents a Least Significant Bit (LSB) and $x_{M+1}(m)$ represents a Most Significant Bit (MSB). Using the Gray (or other) code, the M+1 output bits may be mapped to $2^{M+1}$-PAM as described below. As $K=2^{M+1}$, the K normalized constellation points may be defined as $$\text{the } p\text{-th point} = \frac{(2p - K + 1)}{K} \qquad p = 0, \ldots, K-1,$$

where $$p = \sum_{l=1}^{M+1} 2^l x_l,$$

represents a decimal representation of the M+1 bits, where $x_1$ is the LSB. In other words, the M+1 bits $x_1, x_2, \ldots, x_{M+1}$ are mapped to the p-th normalized constellation point, e.g., $$x_1, x_2, \ldots, x_{M+1} \rightarrow \frac{(2p - K + 1)}{K}, \qquad p = 0, \ldots, K-1.$$

For example, if M=7, K=128 and the normalized 128 constellation points are represented as:

$$\frac{(2p - 127)}{128}, \qquad p = 0, \ldots, 128.$$

For a fixed point implementation, the normalized constellation points may be represented using B binary bits in 2's complement form. The number of bits B may be larger than M+1 where the extra bits B−M−1 may determine the precision available for soft decision on the decoder and the overall performance of the Trellis Coded Modulation (TCM) scheme. For example, at least 8 extra bits may be provided for soft decision, e.g., $B \geq M+9$.

An exemplary listing of 128-PAM points are shown in FIGS. 1b and 1c. FIG. 1b illustrates mapper definition for M=6 and a 128 PAM scenario. Column 130 indicates mapper-in, column 132 indicates output level; column 134 indicates output (HEX), column 136 indicates mapper-in; column 138 indicates output level and column 140 indicates output (HEX). FIG. 1c illustrates additional information for the M=6 and a 128 PAM scenario. Column 150 indicates mapper-in, column 152 indicates output level; column 154 indicates output (HEX), column 156 indicates mapper-in; column 158 indicates output level and column 160 indicates output (HEX). The binary representation of the output of the mapper may be given with B=16.

As mentioned above, there is generally no other signal processing requirement to support the larger constellation for RE-SHDSL of an embodiment of the present invention. In other words, following the mapper of FIG. 2 the signal processing for the RE-SHDSL is identical (or substantially similar) to that of the SHDSL. Hence, most or all the blocks that follow the TCM-mapper remain unchanged. In particular, the precoder, transmit filter, and analog front end do not require modification.

The ITU standard for SHDSL specifies transmit power spectral densities, e.g., transmit masks, for every supported rate from 192 kbps to 2.312 Mbps with 8 kbps increment. According to an embodiment of the present invention, the RE-SHDSL transmit signal uses one of the masks defined in SHDSL standard. The selection process for a transmit mask involves using an appropriate transmit mask corresponding to the SHDSL rate $R_d$. The enhanced data rate $R_{ed}$ is defined as $(M/3)R_d$ where $R_d$ is the original SHDSL rate and M is number of data bits per symbol. For each M, every enhanced data rate $R_{ed}$ corresponds to a SHDSL data rate $R_d$ and hence, a specific transmit mask. For an enhanced data rate $R_{ed}$, an embodiment of the present invention uses a transmit mask corresponding to the SHDSL rate $R_d$, thereby eliminating a need for any new transmit masks and guarantees spectral compatibility and transparency to other users.

According to another embodiment of the present invention, the RE-SHDSL receiver may include a deframer and a Trellis decoder. The deframer may provide added capacity for handling enhanced data rates. The Trellis decoder may be redesigned to handle a constellation size higher than 16-PAM. Additional bits added to the RE-SHDSL may be uncoded bits, which do not effect the convolutional coding. As a result, it is possible to design the Trellis decoder to accommodate higher constellations with minimal change. In addition, the Gray code used in the mapper definition may simplify the decoder design for higher constellations. One such implementation may include a situation where the major blocks of the decoder remain substantially same with minor changes to the input and output stages. Using such an implementation of the Trellis decoder, a SHDSL receiver may be modified to handle RE-SHDSL with minimal redesign effort.

For practical implementations, the constellation size cannot be increased without limit, e.g., the value of M cannot be too larger. Generally, for every additional bit, the signal to noise ratio (SNR) required at the receiver may increase by approximately 6 dB. For example, with M=6 the required SNR is about 43.5 dB as opposed to the 27.5 dB required for SHDSL.

Various modifications may be implemented for a standard SHDSL transceiver to incorporate RE-SHDSL functionality. RE-SHDSL frame structure has the ability to handle a higher payload rate or larger payload blocks. In particular, the maximum allowed value for the parameter n, that determines the payload rate and the payload block size, is 12M instead of 36 as specified in SHDSL. Note that M (>3) is the number of bits per symbol for the RE-SHDSL system.

The TCM-encoder may accommodate a larger number of uncoded bits as shown in FIG. 2. This effects the serial to parallel converter 210 and the mapper block 230 within the TCM-encoder. The Trellis decoder block in the receiver may accommodate higher size constellations. As pointed out, there are efficient implementations available that require minimal changes to the decoder block. In the exemplary case where M=4, a 4-bit serial to parallel converter and a 16-PAM mapper may be implemented where d(n) may be converted into a 4 bit word, which may include $s_1(m), s_2(m), s_3(m)$ and $s_4(m)$. Convolutional encoder 220 may receive first bit $s_1(m)$ and generate two bits $x_1(m)$ and $x_2(m)$. The 16-PAM mapper 230 may receive $x_1(m), x_2(m), x_3(m), x_4(m)$ and $x_5(m)$ to generate y(m).

RE-SHDSL of an embodiment of the present invention is an efficient and easy to implement approach for increasing the data rate of existing SHDSL transceivers. The rate enhancement may be achieved by increasing the number of data bits per symbol (M>3). Generally, the SHDSL standard specifies the use of 3 bits per symbol and 16-PAM constellation. In contrast, 4 or more bits per symbol and constellation size larger than 16-PAM are used in RE-SHDSL of an embodiment of the present invention. In addition, an embodiment of the present invention provides a method for effective use of larger constellations.

The RE-SHDSL of an embodiment of the present invention achieves a higher data rate without requiring any additional transmit bandwidth or transmit power. The rate enhancement achieved by RE-SHDSL of an embodiment of the present invention is flexible compared to the standard specified four wire approach. The rate enhancement may depend in part on the number of bits per symbol M. As in SHDSL, RE-SHDSL of an embodiment of the present invention may use a single pair of wire, at a minimum. RE-SHDSL uses the same (or substantially similar) set of transmit masks as specified in SHDSL standard. As a result, there is no need for additional transmit masks. RE-SHDSL satisfies spectral compatibility requirements and is transparent to other applications. Deployment of RE-SHDSL does not create additional crosstalk to other services. RE-SHDSL is further compatible with four wire operations as well as other modes. For example, RE-SHDSL may be used in a four wire mode to achieve an additional doubling of data rate. RE-SHDSL may be used for both region specific Annexes A and B of the ITU standard G.992.1 for SHDSL, as well as other standards.

According to another aspect of the present invention, an efficient iterative algorithm for the computation of pre-equalizer coefficients is provided. A pre-equalizer is a non-adaptive filter that precedes the adaptive equalizer filter. The pre-equalizer serves to counteract against fixed components of a communication channel. An algorithm of an embodiment of the present invention may be used to compute pre-equalizer coefficients in an optimal manner based on a worst case mean square error minimization.

A pre-equalizer may be considered a non-adaptive component of an overall equalizer structure. Linear distortion to be corrected by the equalization process may be partly caused by known transmit filter characteristics. This results in a common component for different channel scenarios where the use of a pre-equalizer block basically targets to exploit this fact. Viewing the functioning of a feedforward filter as a combination of signal to noise ratio (SNR) improvement through matched filtering and post-cursor inter symbol interference (ISI) correction motivates the use of a pre-equalizer to match the stationary component of the channel. This provides a greater degree of freedom for the feedforward equalizer to handle ISI.

A pre-equalizer block increases an effective equalizer length without increasing the number of taps to be trained. This provides potentially longer loops as the need for a longer equalizer increases with the increasing impulse response length of longer loops.

An increased equalizer length also improves SNR performance in noise cases by enhancing the ability to increase noise rejection and ISI compensation. This property is especially beneficial for cases where the SNR gap between an infinite length Decision Feedback Equalizer (DFE) and a finite impulse response (FIR) DFE equalizer is considerably large. Even in the cases where this gap is small, use of a pre-equalizer may provide enhanced whitening of an error spectrum and therefore an improved Bit Error Rate (BER) performance.

The use of a pre-equalizer may also increase the speed and performance of equalizer training, in particular, a blind section, by providing a pre-processing of the signal input to the equalizer.

Figure 3:
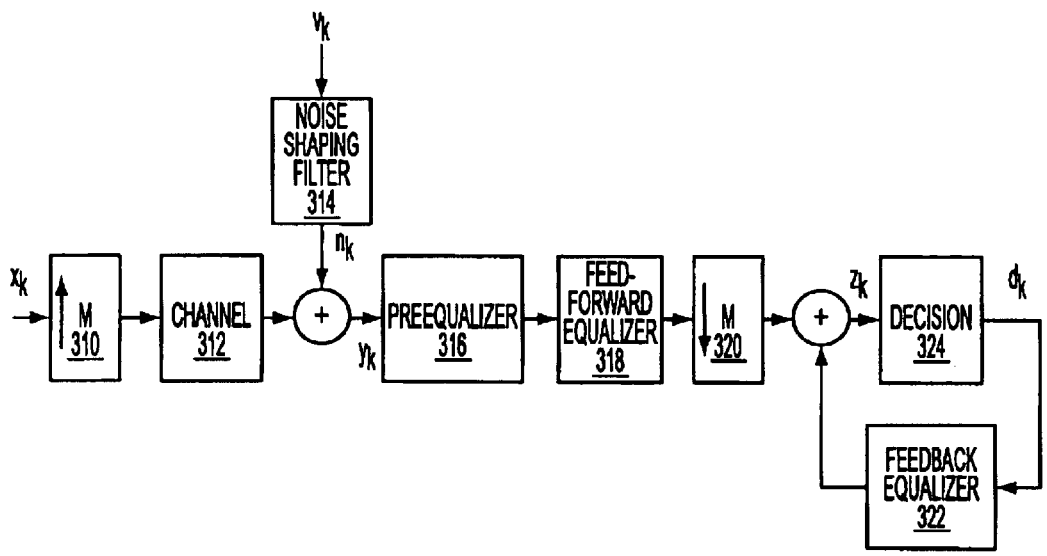
FIG. 3 illustrates a setup for fractionally spaced DFE with pre-equalizer, according to an embodiment of the present invention.

An embodiment of the present invention is directed to providing an algorithm for computing pre-equalizer coefficients. FIG. 3 illustrates an overall equalization model for a fractionally spaced Decision Feedback Equalizer (DFE) with an oversampling factor M that employs a pre-equalizer filter, according to an embodiment of the present invention.

Signal $x_k$ represents a transmitted digital input sequence that is received by upsampling block 310. Signal $x_k$ is upsampled by a factor M at 310, where upsampling may involve the insertion of M−1 zeros in between the samples of signal $x_k$. Other methods of upsampling may also be implemented. The upsampled signal is received by channel 312. Channel 312 models an overall linear distortion caused by a combination of a transmit filter, communication medium and/or a receive filter. Channel 312 may be modeled by a linear time invariant filter with coefficients $h_l$. An output of channel 312 may be corrupted by a noise sequence $n_k$ where $n_k$ is formed by passing a white noise sequence $v_k$ through a noise shaping filter 314 with an impulse response $g_k$.

Signal $y_k$ is an input sequence received by pre-equalizer 316 which may include a combination of an output of channel 312 and noise sequence $n_k$. The pre-equalizer 316 and decision feedback equalizer, which may include components such as feed-forward equalizer 318 and feedback equalizer 322, process signal $y_k$ to counteract against the effects of channel and noise.

Signal $y_k$ is first processed by a pre-equalizer filter 316 with impulse response $\{p_k; k \in \{0, \ldots, 2N_P-1\}\}$ where the pre-equalizer filter may be non-adaptive. The output of the pre-equalizer filter 316 is further filtered by a feed-forward equalizer 318 with coefficients $\{f_k; k \in \{0, \ldots, 2N_F-1\}\}$ where the feed-forward equalizer may be adaptive and then downsampled by a factor M by downsampling block 320. Downsampling may involve selecting one sample out of M consecutive samples.

The output of the downsampling unit 320 may be combined with an output of a feedback equalizer 322 to produce output sequence $z_k$ where the feedback equalizer 322 may be adaptive. The feedback equalizer processes the previous decisions where the feedback equalizer has coefficients $\{b_k; k \in \{0, \ldots, N_B-1\}\}$. Finally, the decision unit 324 uses $z_k$ to produce final decisions $d_k$.

Figure 4:
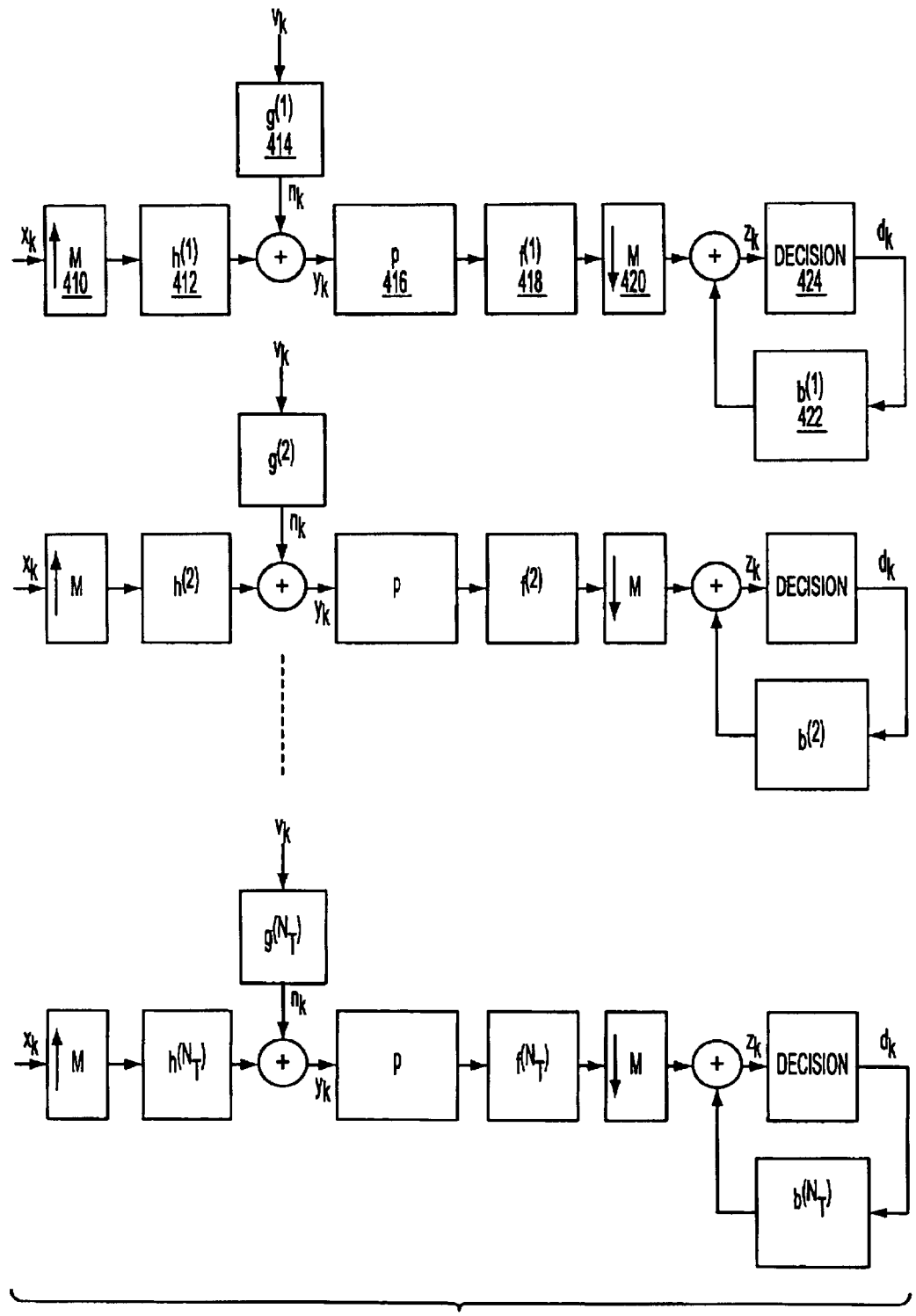
FIG. 4 illustrates a pre-equalizer design test case, according to an embodiment of the present invention.

According to an embodiment of the present invention, the algorithm performs the computation of the pre-equalizer coefficients for the structure, such as one illustrated in FIG. 3 where M=2. As shown in FIG. 4, there may exist $N_T$ test cases with corresponding channel impulse responses 412 $(\{h_l^{(i)}; l \in \{0, \ldots, N_C-1\}, i \in \{0, \ldots, N_T\}\})$ and noise shaping filters 414 $\{g_k^{(i)}; k \in \{0, \ldots, N_G-1\}, i \in \{0, \ldots, N_G-1\}$ that may be targeted to optimize the pre-equalizer coefficients. As shown in FIG. 4, pre-equalizer coefficients 416 $\{p_k\}$ are kept fixed while the adaptive feedforward filter coefficients 418 $\{f_k^{(i)}\}$ and the adaptive feedback equalizer coefficients 422 $\{b_k^{(i)}\}$ may be different for each test case.

An embodiment of the present invention provides an algorithm for computing static pre-equalizer coefficients and minimizing the maximum value of the mean square of the error between $z_k$ and $x_k$ over a range of possible test cases.

Algorithm parameters may include predetermined constants independent of the data to be used in the algorithm. The following values may be adjusted to achieve different levels of performance.

$N_P$: Half Pre-equalizer Length.
$N_F$: Half Feedforward Equalizer Length.
$N_B$: Feedback Equalizer Length.
$N_I$: Number of algorithm iterations.
$N_C$: Half Channel Length.
$N_T$: Number of test cases.
$\sigma^2_x$: Transmit signal power.
$N_G$: The length of noise shaping filter.
$\{g_l^{(i)}, l \in \{0, \ldots, N_G-1\}\}$: The impulse response of a noise shaping filter for the $i^{th}$ test case.
$\{h_l^{(i)}, l \in \{0, \ldots, 2N_C-1\}\}$: The channel impulse response for the $i^{th}$ test case.
$\{h_{e,l}^{(i)}, l \in \{0, \ldots, N_C-1\}\}$: The even-indexed samples of a channel impulse response for the $i^{th}$ test case, where $$h_{e,l}^{(i)} = h_{2l}^{(i)} \; l \in \{0, \ldots, N_C-1\}$$

$\{h_{o,l}^{(i)}, l \in \{0, \ldots, N_C-1\}\}$: The odd-indexed samples of a channel impulse response for the $i^{th}$ test case, where $$h_{o,l}^{(i)} = h_{2l+1}^{(i)} \; l \in \{0, \ldots, N_C-1\}$$

The following provides descriptions of variables that may be used in an algorithm of an embodiment of the present invention.

$\{p_l, l \in \{0, \ldots, 2N_P-1\}\}$: The pre-equalizer filter coefficients.
$\{p_{e,l}, l \in \{0, \ldots, N_P-1\}\}$: The even-indexed pre-equalizer filter coefficients, where $$p_{e,l} = p_{2l} \; l \in \{0, \ldots, N_P-1\}.$$

$\{p_{o,l}, l \in \{0, \ldots, N_P-1\}\}$: The odd-indexed pre-equalizer filter coefficients, where $$p_{o,l} = p_{2l+1} \; l \in \{0, \ldots, N_P-1\}.$$

p: $(2N_P \times 1)$ pre-equalizer coefficient vector:

$$p = \begin{bmatrix} p_{e,0} \\ p_{e,1} \\ \vdots \\ p_{e,N_P-1} \\ p_{o,0} \\ p_{o,1} \\ \vdots \\ p_{o,N_P-1} \end{bmatrix}.$$

$\{f_k^{(i)}, k \in \{0, \ldots, 2N_F-1\}\}$: Feedforward filter coefficients in the $i^{th}$ test case.
$\{f_{e,k}^{(i)}, k \in \{0, \ldots, N_F-1\}\}$: Even feedforward filter coefficients in the $i^{th}$ test case, where $$f_{e,k}^{(i)} = f_{2k}^{(i)} \; k \in \{0, \ldots, N_F-1\}$$

$\{f_{o,k}^{(i)}, k \in \{0, \ldots, N_F-1\}\}$: Odd feedforward filter coefficients in the $i^{th}$ test case.

$$f_{o,k}^{(i)} = f_{2k+1}^{(i)} \; k \in \{0, \ldots, N_F-1\}$$

$f^{(i)}$: Feedforward coefficient vector in the $i^{th}$ test case:

$$f^{(i)} = \begin{bmatrix} f_{e,0}^{(i)} \\ f_{e,1}^{(i)} \\ \vdots \\ f_{e,N_F-1}^{(i)} \\ f_{o,0}^{(i)} \\ f_{o,1}^{(i)} \\ \vdots \\ f_{o,N_F-1}^{(i)} \end{bmatrix}.$$

$\{b_k^{(i)}, k \in \{0, \ldots, N_B-1\}\}$: Feedback coefficients in the $i^{th}$ test case.
b(i): Feedback coefficient vector:

$$b^{(i)} = \begin{bmatrix} b_0^{(i)} \\ b_1^{(i)} \\ \vdots \\ b_{N_B-1}^{(i)} \end{bmatrix}.$$

$L_1^{(i)}$: scalar, length variable.
$L_2^{(i)}$: scalar, length variable.
$L_3^{(i)}$: scalar, length variable.
$L_d^{(i)}$: $(d^{(i)} + L_3^{(i)} + 1 \times 1)$ Vector, intermediate variable.
$Q^{(i)}$: $(N_B + L_3^{(i)} - d^{(i)} \times N_T \times N_B)$ Matrix, intermediate variable.
$C_o^{(i)}$: $(N_F + N_P \times N_F + N_P + N_C - 1)$ Matrix, odd channel convolution matrix.
$C_e^{(i)}$: $(N_F + N_P - 1 \times N_F + N_P + N_C - 2)$ Matrix, even channel convolution matrix.
$C^{(i)}$: $(2N_F + 2N_P - 1 \times L_3^{(i)})$ Matrix, intermediate variable.
$q^{(i)}$: $(1 \times 2N_P + N_B N_T)$ Vector, intermediate variable.

$Z^{(i)}$: ($2N_P+N_BN_T \times 2N_P+N_BN_T$) Matrix, intermediate variable.

$A^{(i)}$: (($N_TN_B+2N_P) \times (N_TN_B+2N_P)$) Matrix, intermediate variable.

t: scalar, intermediate search variable used in optimization algorithm.

$G^{(i)}$: ($N_P+N_F-1 \times N_P+N_F+N_G-2$) Matrix, convolution matrix for the noise shaping filter.

$M^{(i)}$: ($N_B \times L_1^{(i)}$) Matrix, intermediate variable.

$H_o^{(i)}$: ($N_F+N_P-1) \times N_F+N_P+N_C-2$) Matrix, odd channel convolution matrix.

$H_e^{(i)}$: ($N_F+N_P-1) \times N_F+N_P+N_C-2$) Matrix, even channel convolution matrix.

$H^{(i)}$: ($N_F+N_P-1 \times L_1^{(i)}$) Matrix, intermediate variable.

$P_o$: ($N_F \times N_F+N_P-1$) Matrix, odd pre-equalizer convolution matrix.

$P_e$: ($N_F \times N_F+N_P-1$) Matrix, even pre-equalizer convolution matrix.

$P_1$: ($N_F \times 2N_F+2N_P-1$) Matrix, intermediate variable.

$P_2$: ($N_F \times 2N_F+2N_P-1$) Matrix, intermediate variable.

P: ($2N_F \times 2N_F+2N_P-1$) Matrix, intermediate variable.

$Rs_{n,n-d}^{l,i}$: ($2N_F+N_B \times 1$) Matrix, cross correlation vector.

$Rs_n^l$: ($2N_F+N_B \times 2N_F+N_B$) Matrix, covariance matrix.

Figure 5:
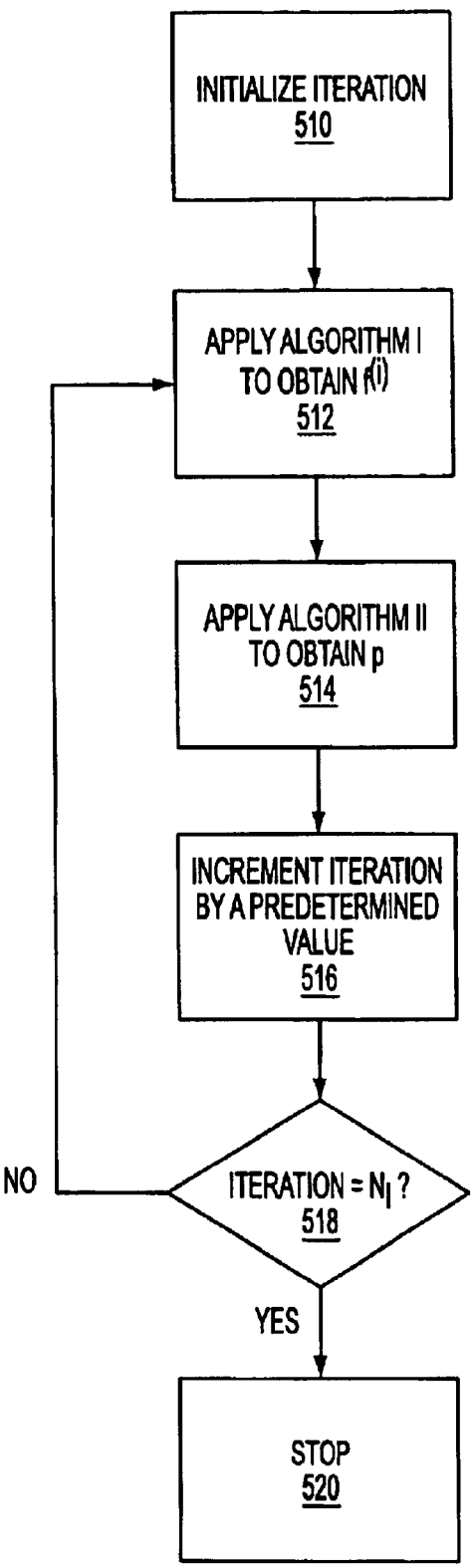
FIG. 5 is a flowchart illustrating of an algorithm for determining pre-equalizer coefficients, according to an embodiment of the present invention.

FIG. 5 illustrates a flowchart of an algorithm for determining pre-equalizer coefficients, according to an embodiment of the present invention. At step 510, iteration may be initialized to a predetermined value, such as 0. At step 512, Algorithm-I described below may be applied to obtain f(i) for all i=1, ..., $N_T$. At step 514, Algorithm-II described below may be applied to obtain p. At step 516, iteration may be incremented by a predetermined value, such as 1. For example, iteration may be set to iteration+1. At step 518, it may be determined whether iteration=$N_l$. If so, then stop at step 520 else go to step 512.

ALGORITHM-I

Step 1. Set $L_1^{(i)}$ as the maximum of the following 2 quantities:

$N_P+N_C+N_F-2$, $d^{(i)}+1+N_B$

Step 2. Set $L_2^{(i)}$ using the formula $L_2^{(i)} = L_1^{(i)} - N_C - N_F - N_P + 1$.

Step 3. Form the ($N_P+N_F-1) \times (N_P+N_F+N_G-2$) matrices $G^{(i)}$ for all i=1, ..., $N_T$ using the formula $$G^{(i)} = \begin{bmatrix} 0 & g_0^{(i)} & g_1^{(i)} & g_2^{(i)} & \cdots & g_{N_G-2}^{(i)} & g_{N_G-1}^{(i)} & 0 & \cdots & 0 & 0 \\ 0 & 0 & 0 & g_0 & \cdots & g_{N_G-4}^{(i)} & g_{N_G-3}^{(i)} & g_{N_G-2}^{(i)} & \cdots & 0 & 0 \\ \vdots & \ddots & \ddots & \ddots & \ddots & \ddots & \ddots & \ddots & \ddots & \ddots & \vdots \\ \cdots & \cdots & \cdots & \cdots & \cdots & \cdots & \cdots & \cdots & g_{N_G-1}^{(i)} & 0 \\ g_0^{(i)} & g_1^{(i)} & g_2^{(i)} & g_3^{(i)} & \cdots & g_{N_G-1}^{(i)} & 0 & 0 & \cdots & 0 & 0 \\ 0 & 0 & g_0^{(i)} & g_1^{(i)} & \cdots & g_{N_G-3}^{(i)} & g_{N_G-2}^{(i)} & g_{N_G-1}^{(i)} & \cdots & 0 & 0 \\ \vdots & \ddots & \ddots & \ddots & \ddots & \ddots & \ddots & \ddots & \ddots & \ddots & \vdots \\ \cdots & \cdots & \cdots & \cdots & \cdots & \cdots & \cdots & \cdots & g_{N_G-2}^{(i)} & g_{N_G-1}^{(i)} \end{bmatrix}.$$

Step 4. Form the $N_B \times L_1^{(i)}$ matrices $M^{(i)}$ for all i=1, ..., $N_T$, using the formula $M^{(i)} = [0_{N_B \times 1}\ IN_B\ 0_{N_B \times L_1^{(i)} - d^{(i)} - 1 - N_B}]$.

Step 5. Form the ($N_F+N_P) \times (N_F+N_P+N_C-1$) matrices $H_o^{(i)}$ for all i=1, ..., $N_T$, using the formula $$H_o^{(i)} = \begin{bmatrix} h_{o,0}^{(i)} & h_{o,1}^{(i)} & h_{o,2}^{(i)} & \cdots & h_{o,N_C-1}^{(i)} & 0 & 0 & \cdots \\ 0 & h_{o,0}^{(i)} & h_{o,1}^{(i)} & \cdots & h_{o,N_C-2}^{(i)} & h_{o,N_C-1}^{(i)} & 0 & \cdots \\ \vdots & \ddots & \ddots & \ddots & \ddots & \ddots & \ddots & \vdots \\ 0 & 0 & 0 & \cdots & \cdots & \cdots & \cdots & h_{o,N_C-1}^{(i)} \end{bmatrix}.$$

Step 6. Form the ($N_F+N_P-1) \times (N_F+N_P+N_C-1$) matrices H for all i=1, ..., $N_T$, using the formula $$H_e^{(i)} = \begin{bmatrix} h_{e,0}^{(i)} & h_{e,1}^{(i)} & h_{e,2}^{(i)} & \cdots & h_{e,N_C-1}^{(i)} & 0 & 0 & \cdots & 0 \\ 0 & h_{e,0}^{(i)} & h_{e,1}^{(i)} & \cdots & h_{e,N_C-2}^{(i)} & h_{e,N_C-1}^{(i)} & 0 & \cdots & 0 \\ \vdots & \ddots & \ddots & \ddots & \ddots & \ddots & \ddots & \vdots & \vdots \\ 0 & 0 & 0 & \cdots & \cdots & \cdots & \cdots & h_{e,N_C-1}^{(i)} & 0 \end{bmatrix}.$$

Step 7. Form the matrices $H^{(i)}$ for all i=1, ..., $N_T$, using the formula $$H^{(i)} = \begin{bmatrix} H_e^{(i)} & 0_{N_F+N_P-1 \times L_2^{(i)}} \\ H_o^{(i)} & 0_{N_F+N_P \times L_2^{(i)}} \end{bmatrix}.$$

Step 8. Form the $N_F \times (N_F+N_P-1)$ matrix $P_o$ using the formula $$P_o = \begin{bmatrix} p_{o,0} & p_{o,1} & p_{o,2} & \cdots & p_{o,N_P-1} & 0 & 0 & \cdots \\ 0 & p_{o,0} & p_{o,1} & \cdots & p_{o,N_P-2} & p_{o,N_P-1} & 0 & \cdots \\ \vdots & \ddots & \ddots & \ddots & \ddots & \ddots & \ddots & \vdots \\ 0 & 0 & 0 & \cdots & \cdots & \cdots & \cdots & p_{o,N_P-1} \end{bmatrix}.$$

Step 9. Form the $N_F \times (N_F+N_P-1)$ matrix $P_e$ using the formula $$P_e = \begin{bmatrix} p_{e,0} & p_{e,1} & p_{e,2} & \cdots & p_{e,N_P-1} & 0 & 0 & \cdots \\ 0 & p_{e,0} & p_{e,1} & \cdots & p_{e,N_P-2} & p_{e,N_P-1} & 0 & \cdots \\ \vdots & \ddots & \ddots & \ddots & \ddots & \ddots & \ddots & \vdots \\ 0 & 0 & 0 & \cdots & \cdots & \cdots & \cdots & p_{e,N_P-1} \end{bmatrix}.$$

Step 10. Form the matrix $P_1$ using the formula $P_1 = [P_e\ 0_{N_F \times 1}\ P_o]$ Step 11. Form the matrix $P_2$ using the formula $P_2 = [P_o\ P_e\ 0_{N_F \times 1}]$.

Step 12. Form the matrix P using the formula $$P = \begin{bmatrix} P_1 \\ P_2 \end{bmatrix},$$

Step 13. Finally compute $f^{(i)}$ for all i=1, ..., $N_T$, using the formula $f(i) = (P(H^{(i)}(I-M^{(i)}M^{(i)T})H^{(i)T}+G^{(i)}G^{(i)T})^{(i)}P^T)^{-1}PH^{(i)}$ Algorithm II Step 1. Set $L_3^{(i)}$ as the maximum of the below 2 quantities:

$$d^{(i)}+N_B$$

$$N_P+N_F+N_C-1$$

Step 2. Form the matrices $L_d^{(i)}$ for all $i=1, \ldots, N_T$, using the formula $$L_d^{(i)} = \begin{bmatrix} 0_{d^{(i)}-1 \times 1} \\ 2\sigma_X^2 \\ 0_{L_3^{(i)}-d^{(i)} \times 1} \end{bmatrix},$$

Step 3. Form the $N_F+N_P \times N_F+N_P+N_C-1$ matrices $C_o^{(i)}$ for all $i=1, \ldots, N_T$ using the formula $$C_o^{(i)} = \begin{bmatrix} h_{o,0}^{(i)} & h_{o,1}^{(i)} & h_{o,2}^{(i)} & \cdots & h_{o,N_C-1}^{(i)} & 0 & 0 & \cdots \\ 0 & h_{o,0}^{(i)} & h_{o,1}^{(i)} & \cdots & h_{o,N_C-2}^{(i)} & h_{o,N_C-1}^{(i)} & 0 & \cdots \\ \vdots & \ddots & \ddots & \ddots & \ddots & \ddots & \ddots & \vdots \\ 0 & 0 & 0 & \cdots & \cdots & \cdots & \cdots & h_{o,N_C-1}^{(i)} \end{bmatrix}.$$

Step 4. Form the $N_F+N_P-1 \times N_F+N_P+N_C-2$ matrices $C_e^{(i)}$ for all $i=1, \ldots, N_T$ using the formula $$C_e^{(i)} = \begin{bmatrix} h_{e,0}^{(i)} & h_{e,1}^{(i)} & h_{e,2}^{(i)} & \cdots & h_{e,N_C-1}^{(i)} & 0 & 0 & \cdots \\ 0 & h_{e,0}^{(i)} & h_{e,1}^{(i)} & \cdots & h_{e,N_C-2}^{(i)} & h_{e,N_C-1}^{(i)} & 0 & \cdots \\ \vdots & \ddots & \ddots & \ddots & \ddots & \ddots & \ddots & \vdots \\ 0 & 0 & 0 & \cdots & \cdots & \cdots & \cdots & h_{e,N_C-1}^{(i)} \end{bmatrix}.$$

Step 5. Form the matrices $C^{(i)}$ for all $i=1, \ldots, N_T$ using the formula $$C^{(i)} = \begin{bmatrix} C_e^{(i)} & 0_{(N_P+N_F-1) \times (L_3^{(i)}-N_P-N_F-N_C+2)} \\ C_o^{(i)} & 0_{(N_P+N_F) \times (L_3^{(i)}-N_P-N_F-N_C+1)} \end{bmatrix}$$

Step 6. Form the matrices $Q^{(i)}$ for all $i=1, \ldots, N_T$ using the formula $$Q^{(i)} = \begin{bmatrix} 0_{d^{(i)} \times (i-1)N_B} & 0_{d^{(i)} \times N_B} & 0_{d^{(i)} \times (N_T-i)N_B} \\ 0_{N_B \times (i-1)N_B} & I_{N_B} & 0_{N_B \times (N_T-i)N_B} \\ 0_{(L_3^{(i)}-d^{(i)}-N_B) \times (i-1)N_B} & 0_{(L_3^{(i)}-d^{(i)}-N_B) \times N_B} & 0_{(L_3^{(i)}-d^{(i)}-N_B) \times (N_T-i)N_B} \end{bmatrix}.$$

Step 7. Form the $N_P-1 \times N_F+N_P$ matrices $F_{11}^{(i)}$ for all $i=1, \ldots, N_T$ using the formula $$F_{11}^{(i)} = \begin{bmatrix} 0 & f_{e,0}^{(i)} & f_{e,1}^{(i)} & f_{e,2}^{(i)} & \cdots & \cdots & \cdots & f_{e,N_F-1} & 0 & 0 & \cdots & 0 & 0 \\ 0 & 0 & f_{e,0}^{(i)} & f_{e,1}^{(i)} & \cdots & \cdots & \cdots & f_{e,N_F-2} & f_{e,N_F-1} & 0 & \cdots & 0 & 0 \\ \vdots & \ddots & \ddots & \ddots & \ddots & \ddots & \ddots & \ddots & \ddots & \ddots & \ddots & \ddots & \vdots \\ 0 & 0 & 0 & \cdots & f_{e,0} & \cdots & \cdots & \cdots & \cdots & \cdots & \cdots & f_{e,N_F-1} & 0 \end{bmatrix}.$$

Step 8. Form the $N_P-1 \times N_F+N_P-1$ matrices $F_{12}^{(i)}$ for all $i=1, \ldots, N_T$, using the formula $$F_{12}^{(i)} = \begin{bmatrix} f_{o,0}^{(i)} & f_{o,1}^{(i)} & f_{o,2}^{(i)} & \cdots & \cdots & f_{o,N_F-1} & 0 & 0 & \cdots & 0 & 0 \\ 0 & f_{o,0}^{(i)} & f_{o,1}^{(i)} & \cdots & \cdots & f_{o,N_F-2} & f_{o,N_F-1} & 0 & \cdots & 0 & 0 \\ \vdots & \ddots & \ddots & \ddots & \ddots & \ddots & \ddots & \ddots & \ddots & \ddots & \vdots \\ 0 & 0 & 0 & f_{o,0} & \cdots & \cdots & \cdots & \cdots & \cdots & f_{o,N_F-1} & 0 \end{bmatrix}.$$

Step 9. Form the $N_P \times N_F+N_P$ matrices $F_{21}^{(i)}$ for all $i=1, \ldots, N_T$, using the formula $$F_{21}^{(i)} = \begin{bmatrix} f_{o,0}^{(i)} & f_{o,1}^{(i)} & f_{o,2}^{(i)} & \cdots & \cdots & f_{o,N_F-1} & 0 & 0 & \cdots & 0 & 0 \\ 0 & f_{o,0}^{(i)} & f_{o,1}^{(i)} & \cdots & \cdots & f_{o,N_F-2} & f_{o,N_F-1} & 0 & \cdots & 0 & 0 \\ \vdots & \ddots & \ddots & \ddots & \ddots & \ddots & \ddots & \ddots & \ddots & \ddots & \vdots \\ 0 & 0 & 0 & f_{o,0} & \cdots & \cdots & \cdots & \cdots & \cdots & f_{o,N_F-1} & 0 \end{bmatrix}.$$

Step 10. Form the $N_P \times N_F+N_P-1$ matrices $F_{22}^{(i)}$ for all $i=1, \ldots, N_T$, using the formula $$F_{22}^{(i)} = \begin{bmatrix} f_{e,0}^{(i)} & f_{e,1}^{(i)} & f_{e,2}^{(i)} & \cdots & \cdots & f_{e,N_F-1} & 0 & 0 & \cdots & 0 \\ 0 & f_{e,0}^{(i)} & f_{e,1}^{(i)} & \cdots & \cdots & f_{e,N_F-2} & f_{e,N_F-1} & 0 & \cdots & 0 \\ \vdots & \ddots & \ddots & \ddots & \ddots & \ddots & \ddots & \ddots & \ddots & \vdots \\ 0 & 0 & 0 & f_{e,0} & \cdots & \cdots & \cdots & \cdots & \cdots & f_{e,N_F-1} \end{bmatrix}.$$

Step 11. For $2N_P-1 \times 2N_P+2N_F-1$ matrices $F^{(i)}$ for all $i=1, \ldots, N_T$, using formula $$F^{(i)} = \begin{bmatrix} F_{11}^{(i)} & F_{12}^{(i)} \\ F_{21}^{(i)} & F_{22}^{(i)} \end{bmatrix}.$$

Step 12. Form the matrices $q^{(i)}$ for all $i=1, \ldots, NT$, using formula $$q^{(i)} = L_d^{(i)T}[C^{(i)T}F^{(i)T}Q^{(i)T}]^T.$$

Step 13. Form the matrices $Z^{(i)}$ for all $i=1, \ldots, N_T$, using formula $$Z^{(i)} = \begin{bmatrix} F^{(i)}C^{(i)} \\ Q^{(i)T} \end{bmatrix} \sigma_X^2 \begin{bmatrix} F^{(i)}C^{(i)} \\ Q^{(i)T} \end{bmatrix}^T.$$

Step 14. Form the matrices $A^{(i)}$ by taking square root of matrices $Z^{(i)}$ e.g., $Z^{(i)}=A^{(i)}A^{(i)*}$, where the operation $*$ refers to taking transpose of matrix and taking the complex conjugate of its entries. Here $A^{(i)}$ may be computed using any matrix square root algorithm.

Step 15. Set vector x as $$x = \begin{bmatrix} p \\ b^{(1)} \\ \vdots \\ b^{(N_T)} \end{bmatrix}.$$

Step 16. Solve the following semidefinite programming optimization problem (using any SDP solver or optimization tool with SDP capability)

minimize $t$ $t, p, b^{(1)}, \ldots, b^{(N_T)}$ s.t. $\begin{bmatrix} tI & A^{(i)}x \\ x^T A^{(i)T} & q^{(i)}x + e^{(i)} \end{bmatrix} \geq 0, \quad i = 1 \ldots N_T.$ Step 17. Set $p = x_{1:(N_P)}$ Another aspect of the present invention relates to Analog to Digital Conversion (ADC), which is a process of sampling a continuous-time analog signal in time and mapping these time samples into a digital sequence with finite levels. ADC refers to discretization of an input analog signal in both time and magnitude. For example, Sigma Delta converters provide high resolution analog to digital conversion. The high resolution may be achieved through over-sampling of an input signal at a rate higher than its bandwidth.

A Sigma Delta Analog to Digital (AD) Converter may include at least two stages, such as an Analog Quantizer block and a Digital Combiner-Downsampling block. The Analog Quantizer block oversamples an input analog signal and produces a high-rate digital signal with typically two levels (e.g., 1 bit) or four levels (e.g., 2-bits), for example. This low magnitude resolution over-sampled signal may be converted to a higher magnitude resolution (e.g. 16 bits) and a lower rate signal by the Digital Combiner-Downsampling block.

An embodiment of the present invention is directed to a polyphase combiner and sigma-delta decimator block structure. An embodiment of the present invention provides an efficient implementation of a sigma-delta decimator block which may be enabled by an effective decoupling of a polyphase IIR structure into a cascade of a polyphase FIR bank and a single phase IIR filter. As a result, a reduction in hardware implementation may be achieved by reducing timing requirements for filtering and high rate clock generation. In addition, a reduction in power consumption may be achieved by the use of a lower rate clock. Thus, an embodiment of the present invention provides a low complexity, low power consumption implementation of a sigma delta combiner and decimator blocks through the use of a polyphase structure.

Figure 6:
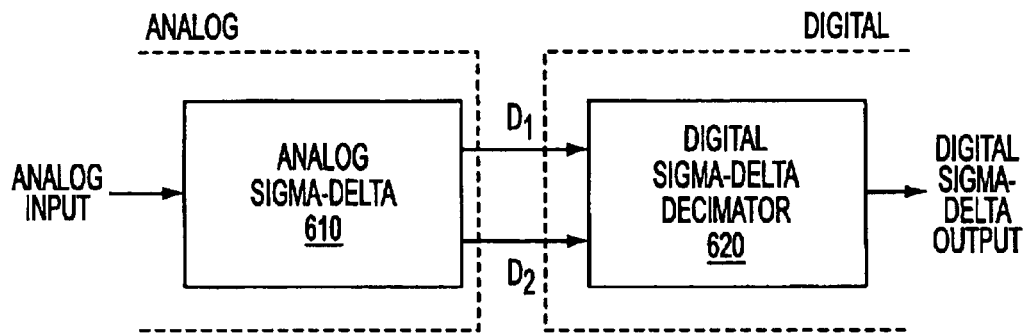
FIG. 6 is a diagram of a receiver sigma-delta block, according to an embodiment of the present invention.

FIG. 6 illustrates an analog to digital converter, according to an embodiment of the present invention. Analog signals are converted into digital signals by A/D Converters by various methods, which may include Sigma-Delta A/D conversion. For high performance Sigma-Delta A/D conversion, an input analog signal may be sampled into a 2-bit (in some cases one bit or other number of bits) high-rate digital signal by Analog Sigma-Delta block 610. The digital signal is then down-sampled and converted into a high resolution (e.g., 16-bit) and lower rate digital signal by a Digital Sigma-Delta Decimator block 620. As shown in FIG. 6, Analog Sigma-Delta block 610 generates a two-bit digital output, $D_1$ and $D_2$. Both $D_1$ and $D_2$ are binary signals with rate R. For example, $D_1$ carries a sampled signal with quantization noise and $D_2$ carries quantization noise cancellation information. The Digital Sigma-Delta Decimator 620 combines $D_1$ and $D_2$ and then decimates the combination by a factor M.

Figure 7:
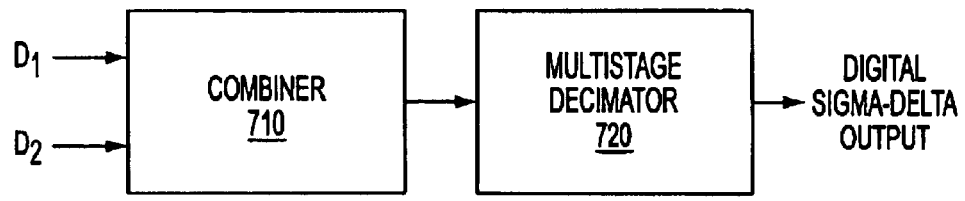
FIG. 7 is a diagram of a digital sigma-delta block, according to an embodiment of the present invention.

FIG. 7 illustrates components of a Digital Sigma-Delta Decimator, according to an embodiment of the present invention. A Digital Sigma-Delta Decimator 620 may include a Combiner 710 and a decimation filter stage which may include a Multistage Decimator 720. Combiner 710 receives $D_1$ and $D_2$ from the Analog Sigma-Delta block 610 and generates a combined signal. The Multistage Decimator 720 receives the combined signal and generates a digital sigma-delta output.

Figure 8:
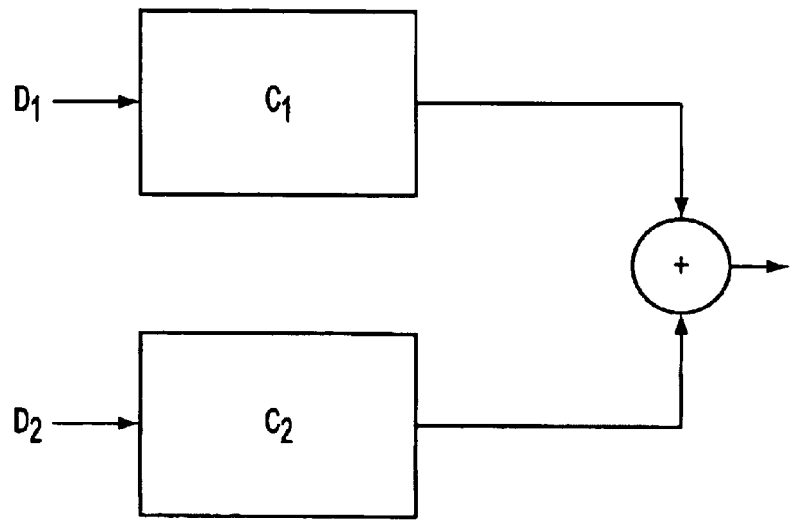
FIG. 8 is a diagram of a combiner structure, according to an embodiment of the present invention.

FIG. 8 illustrates components of a combiner, according to an embodiment of the present invention. Combiner may include two filters, $C_1$ and $C_2$ one for each input branch and a summing junction. For example, $D_1$ may be filtered by filter $C_1$ and $D_2$ may be filtered by filter $C_2$ wherein the filtered signals are combined by a summing junction. Additional filters may be implemented for additional inputs.

Figure 9:
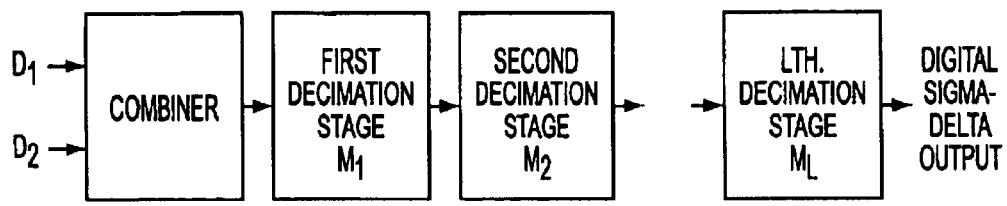
FIG. 9 is a diagram of a digital sigma-delta block with multiple decimation stages, according to an embodiment of the present invention.

FIG. 9 illustrates components of a multistage decimator, according to an embodiment of the present invention. As far as the structure of the decimator is concerned, it may be assumed for an exemplary application that the decimation factor M is not a prime number and therefore may be factored into multiple integer factors, e.g., $M = M_1 M_2 \ldots M_L.$ As a result, the decimator, as shown by 720, may be implemented as a L-stage decimator, as shown in FIG. 9. A sub-sampling factor for the first stage, $M_1$, may be an even number, e.g., $M_1 = 2*N$ where N is an integer. The combined signal of $D_1$ and $D_2$ may be received by a first decimation stage having a sub-sampling factor of $M_1$. The output of the first decimation stage may be received by a second decimation stage having a sub-sampling factor of $M_2$. Finally, a Lth decimation stage having a sub-sampling factor of $M_L$ may generate a digital sigma-delta output.

Figure 10:
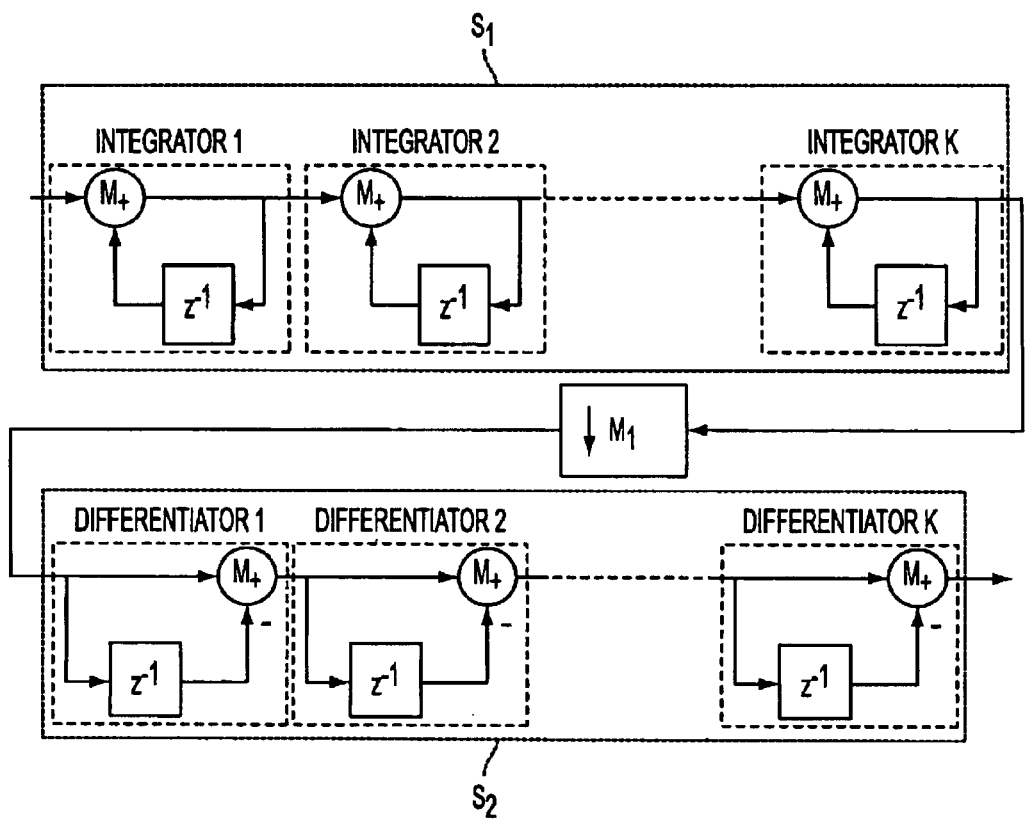
FIG. 10 is a diagram of a first decimator stage with a sinc filter, according to an embodiment of the present invention.

According to one example of an embodiment of the present invention, the first stage may operate with a highest clock rate. The first stage may be implemented with a simple filter such as a Finite Impulse Response (FIR) sinc filter of order K. The combination of the sinc filter and a down-sampling function may be efficiently implemented as shown in FIG. 10. $S_1$ represents a Kth order integrator filter implemented as a cascade of K integrators and $S_2$ represents a Kth order differentiator which may be implemented as a cascade of K differentiators. An advantage of this implementation is that mathematical operations are limited to addition thereby enhancing the simplicity of the method and system.

Figure 11:
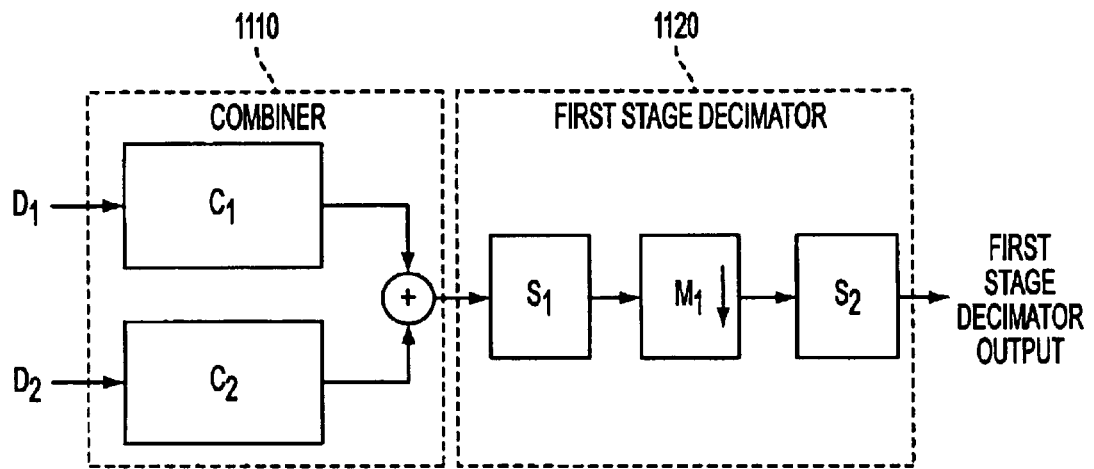
FIG. 11 is a diagram of a combiner-sinc filter, according to an embodiment of the present invention.

FIG. 11 illustrates components of a decimator, according to an embodiment of the present invention. FIG. 11 shows a combiner 1110 and a first stage decimator 1120 with a sinc filter structure. According to an example, the combiner 1110 may operate at a high clock with frequency R MHz. Combiner 1110 includes a filter $C_1$, a filter $C_2$ and a summer. A polyphase structure for the combiner 1110 and sinc filter integrator combination may be implemented such that a lower rate clock may be implemented. This may be accomplished by merging the combiner 1110 and sinc integrator filter operations with a decimation operation as shown by 1120 in FIG. 11. In particular, decimator 1120 includes $S_1$, a downsampling block M and $S_2$. An embodiment of the present invention proposes a low complexity solution for the polyphase structure.

Figure 12:
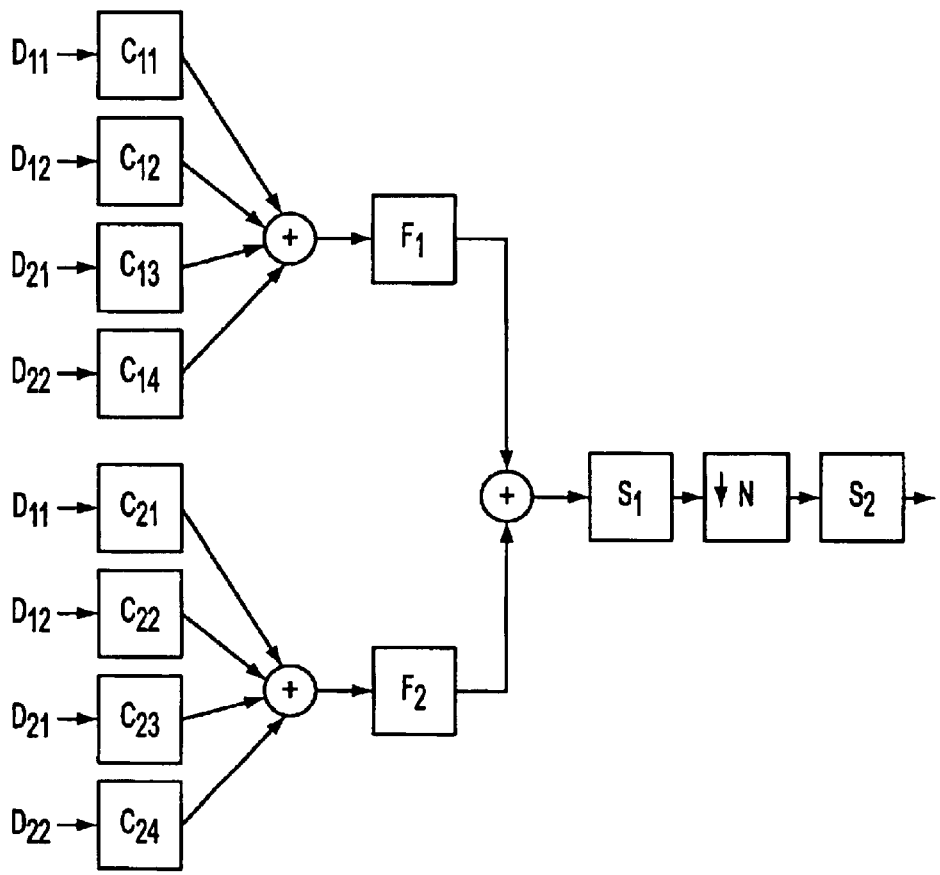
FIG. 12 is a diagram of a polyphase combiner-sinc filter, according to an embodiment of the present invention.

FIG. 12 illustrates a low complexity, efficient polyphase structure, according to an embodiment of the present invention. A first portion of the polyphase structure includes filters $C_{11}$, $C_{12}$, $C_{13}$ and $C_{14}$ for receiving inputs $D_{11}$, $D_{12}$, $D_{21}$, and $D_{22}$ respectively. The outputs of filters $C_{11}$, $C_{12}$, $C_{13}$ and $C_{14}$ are then combined by a first summer and received by filter $F_1$. A second portion of the polyphase structure includes filters $C_{21}$, $C_{22}$, $C_{23}$ and $C_{24}$ for receiving inputs $D_{11}$, $D_{12}$, $D_{21}$, and $D_{22}$ respectively. The outputs of filters $C_{21}$, $C_{22}$, $C_{23}$ and $C_{24}$ are then combined by a second summer and received by filter $F_2$. The outputs of filters $F_1$ and $F_2$ are combined by a third summer and received by a decimator structure. The decimator structure may include a Kth order integrator filter $S_1$, a down-sampling function block N and a Kth order differentiator $S_2$. The decimator structure generates a digital sigma-delta output.

The parameter descriptions used in the structures discussed above may include the following:

Combiner Filter $C_1$ of FIG. 11: Combiner Filter 1 has filter coefficients given as $\{c1_k; k \in \{0, \ldots, (2N_1-1)\}\}$ where $2N_1$ is the filter length which is an even value. $\{c2_k; k \in \{0, \ldots, (2N_2-1)\}\}$ where $2N_2$ is the filter length which is an even value.

According to an embodiment of the present invention as shown in FIG. 12, the following may apply:

Subsampling factor N: $N = M_1/2$.

Filter C11 has coefficients $\{c11_k; k \in \{0, \ldots, N_1-1\}\}$ where $$c11_k = c1_{2k} \quad k \in \{0, \ldots, N_1-1\}.$$

Filter C12 has coefficients $\{c12_k; k \in \{0, \ldots, N_1-1\}\}$ where $c12_0 = 0$ and $$c12_{k+1} = c1_{2k+1} \quad k \in \{0, \ldots, N_1-1\}.$$

Filter C13 has coefficients $\{c13_k; k \in \{0, \ldots, N_2-1\}\}$ where $$c13_k = c2_{2k} \quad k \in \{0, \ldots, N_2-1\}.$$

Filter C14 has coefficients $\{c14_k; k \in \{0, \ldots, N_2-1\}\}$ where $c14_0 = 0$ $$c14_{k+1} = c2_{2k+1} \quad k \in \{0, \ldots, N_2-1\}.$$

Filter C21 has coefficients $\{c21_k; k \in \{0, \ldots, N_1-1\}\}$ where $$c21_k = c1_{2k+1} \quad k \in \{0, \ldots, N_1-1\}.$$

Filter C22 has coefficients $\{c22_k; k \in \{0, \ldots, N_1-1\}\}$ where $$c22_k = c^{(1)}_{2k} \quad k \in \{0, \ldots, N_1-1\}.$$

Filter C23 has coefficients $\{c23_k; k \in \{0, \ldots, N_2-1\}\}$ where $$c23_k = c2_{2k+1} \quad k \in \{0, \ldots, N_2-1\}.$$

Filter C24 has coefficients $\{c24_k; k \in \{0, \ldots, N_2-1\}\}$ where $$c24_k = c2_{2k} \quad k \in \{0, \ldots, N_2-1\}.$$

Filter $F_1$ has coefficients $\{f2_k; k \in \{0, \ldots, L_{F1}-1\}\}$ where $$L_{F1} = \begin{cases} \frac{K+1}{2} & \text{when } K \text{ is odd} \\ \frac{K}{2}+1 & \text{when } K \text{ is even} \end{cases}$$

and $$f1_k = \binom{n}{2k} \quad k \in \{0, \ldots, L_{F1}-1\}.$$

where $\binom{n}{k} = \frac{n!}{(n-k)!k!}$ and $n! = n*(n-1)*\ldots*2*1$.

Filter $F_2$ has coefficients $\{f2_k; k \in \{0, \ldots, L_{F2}-1\}\}$ where $$L_{F2} = \begin{cases} \frac{K+1}{2} & \text{when } K \text{ is odd} \\ \frac{K}{2} & \text{when } K \text{ is even} \end{cases}$$

and $$f2_k = \binom{n}{2k+1} \quad k \in \{0, \ldots, N_{F2}-1\}.$$

For input data sequences $D_{11}$ and $D_{12}$, even sub-samples of $D_1$ may be represented by $D_{11}$ and odd sub-samples of the $D_1$ may be represented by $D_{12}$. An analog sigma delta may provide two outputs, for example, for $D_1$ with one output for $(D_{11})$ and one output for $(D_{12})$ where each line has a rate of R/2. In addition, an analog sigma delta may provide a single output with clock of R/2 with even samples $(D_{11})$ sent at a rising edge and odd samples $(D_{12})$ sent at a falling edge. In the latter case, $D_{11}$ and $D_{12}$ may be obtained as separate lines with rate of R/2 by appropriately sampling the single line output for $D_1$.

For input data Sequences $D_{21}$ and $D_{22}$, even sub-samples of $D_2$ may be represented by $D_{21}$ and odd sub-samples of the $D_2$ may be represented by $D_{22}$. An analog sigma delta may provide two outputs, for example, for $D_2$ with one output for $(D_{21})$ and one output for $(D_{22})$ where each line has a rate of R/2. In addition, an analog sigma delta may provide a single output with clock of R/2 but even samples $(D_{21})$ sent at a rising edge and odd samples $(D_{22})$ sent at a falling edge. In the latter case, $D_{21}$ and $D_{22}$ may be obtained as separate lines with rate of R/2 by appropriately sampling the single line output for $D_1$.

In a Discrete MultiTone (DMT) based communication system (e.g., for supporting ADSL modems), a data stream is partitioned and modulated to be transmitted on several independent sub-channels (also called sub-carriers or tones). Each sub-channel may have a different data rate, depending on transmission conditions and/or other factors. The total data rate of the system may be defined as a summation of the data rates of individual sub-channels. The data rate of each sub-channel may be determined with the consideration of various factors, including the Signal-to-Noise Ratio (SNR) at each tone, the PSD constraint, and/or other considerations. Algorithms that attempt to operate with these often conflicting requirements and further attempt to optimize the data rate allocation among the tones are referenced as bit loading algorithms. According to an embodiment of the present invention, an efficient bit loading algorithm (EBLA) is provided. EBLA may be optimized for DMT systems with a QAM (Quadrature-Amplitude Modulation) scheme and constraints on the transmitting PSD. The bit loading algorithm of an embodiment of the present invention may be applied in any DMT communication systems.

According to an embodiment of the present invention, EBLA may automatically decide whether an optimal solution can be obtained efficiently. If so, an optimal solution is generated. If not, a sub-optimal solution with a performance close to an optimal solution is calculated. For example, EBLA may be optimized for QAM-based systems with PSD constraints where optimal solutions may be obtained efficiently when possible.

An adjustment mechanism may be incorporated into the bit loading algorithm of an embodiment of the present invention to minimize the amount of processing of a Greedy Search Module (GSM). As a result, total computational time may be reduced. When a sub-optimal solution is desired, a water-filling procedure may be implemented to expedite solutions. EBLA may accommodate different modulation and coding methods used in various communication systems.

An embodiment of the present invention provides a reliable and efficient bit loading algorithm for generating an optimal solution when conditions permit, or a sub-optimal solution when computational costs associated with obtaining optimal solutions is formidable.

The following variables may be implemented in the bit loading algorithm of an embodiment of the present invention.

$b_n$ represents the number of data bits allocated to the nth tone, where n represents the tone index. According to an embodiment of the present invention, a total of N tones may be used, e.g., n=1, ..., N. In ADSL systems, $b_n$ may be an integer ranging from 2 to 15, or may be set to 0, for example.

$e_n(b_n)$ represents power allocated at nth tone in order to transmit $b_n$ data bits.

$\Delta e_n(b_n)$ represents an increment in power required at the nth tone to load one more bit, from $b_{n-1}$ bits to $b_n$ bits, e.g., $$\Delta e_n(b_n) = e_n(b_n) - e_n(b_n-1).$$

E represents an aggregate power allocated for the system, e.g., $$E = \sum_{n=1}^{N} e_n(b_n).$$

B represents an aggregate data rate, e.g., $$B = \sum_{n=1}^{N} b_n.$$

$c_n$ represents a PSD constraint at the nth tone. According to an example, the power level allocated for the nth tone may not exceed this constraint, e.g., $e_n(b_n)$ is less than or equal to $c_n$.

P represents an aggregate power budget. This parameter restricts how much power is allocated for the system, e.g., E is less than or equal to P.

$\alpha_n$ represents a tone condition indicator at the nth tone. This parameter may be proportional to the noise power and depend on the choice of coding scheme.

At least two different bit loading scenarios are recognized. A first scenario involves a Bit-Rate Maximization (BRM) problem. In this scenario, the aggregate data rate B is maximized under certain constraints. These constraints may involve the total power being less or equal to P and the power at each tone being less or equal to the PSD constraint, e.g., $e_n(b_n) \leq c_n$. A second scenario involves a Margin Maximization (MM) problem. In this scenario, an aggregate data rate B is given and the total power required by the system is maximized to support that data rate, with or without the PSD and/or other constraints. Other scenarios may be implemented.

For example, in a DMT system, such as a system for supporting ADSL modems, the BRM problem generally occurs more frequently. In this scenario, a total power constraint is closely related to the PSD constraint. As a result, an optimal solution may be obtained easily for the BRM problem. On the other hand, the MM problem is inherently a more complicated scenario. Therefore, an optimal solution may be determined with a much higher computational cost.

EBLA of an embodiment of the present invention exploits advantages of the first scenario (the BRM problem) and generates one or more optimal solutions. For the MM problem, an embodiment of the present invention provides one or more acceptable sub-optimal solutions with a moderate or reasonable computational cost.

Figure 13:
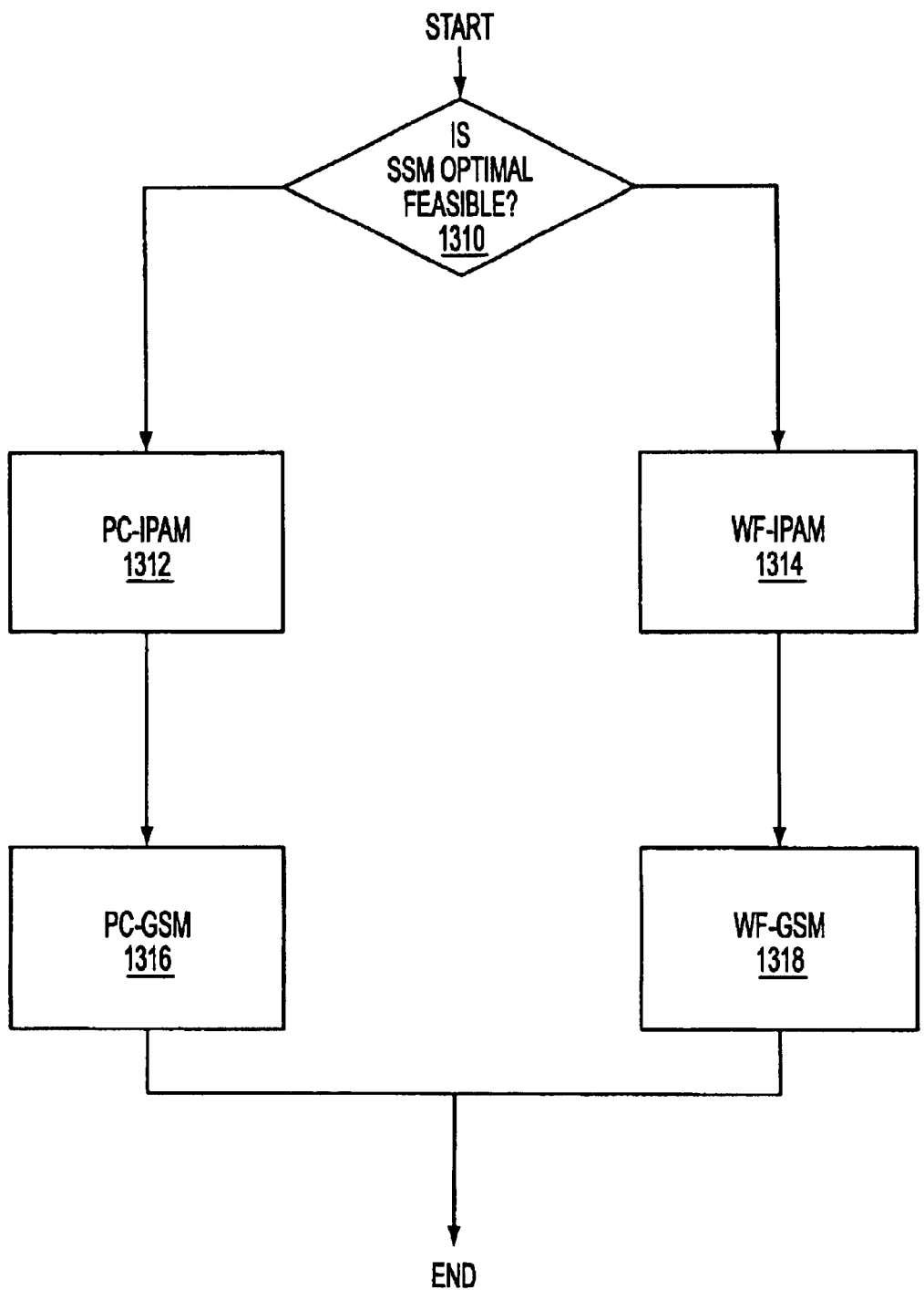
FIG. 13 is the flowchart of an efficient bit loading algorithm, according to an embodiment of the present invention.

FIG. 13 is the flowchart of an efficient bit loading algorithm, according to an embodiment of the present invention. FIG. 13 incorporates functional modules, which may include Scenario Selection Module (SSM) 1310, PSD-Constrained Initial Power/bit Allocation Module (PC-IPAM) 1312, Water-Filling Initial Power/bit Allocation Module (WF-IPAM) 1314, PSD-Constrained Greedy Search Module (PC-GSM) 1316, and Water-Filling Greedy Search Module (WF-GSM) 1318. Other functional modules may also be incorporated in accordance with an embodiment of the present invention.

According to an embodiment of the present invention, there are at least two paths in the execution of the bit loading algorithm. SSM 1310 determines which path to implement based on various conditions and factors. Based on an output of SSM 1310, PC-IPAM 1312 and PC-GSM 1316 may be used to generate optimal bit loading solutions. If an optimal solution is not deemed feasible at SSM 1310, WF-IPAM 1314 and WF-GSM 1318 may be used to generate sub-optimal solutions in an efficient manner.

SSM 1310 decides whether a BRM or MM problem applies and invokes PC-IPAM 1312 or WF-IPAM 1314 accordingly. In addition, SSM 1310 may distinguish among other problems or scenarios as well. SSM 1310 also obtains information on the transmission condition and calculates the tone condition indicator $\alpha_n$, which reflects the condition on the nth tone.

IPAM generates an initial power and/or bit allocation efficiently. In particular, the initial power or bit allocation should be close to an optimal bit loading solution so that a small number of adjustments may be made by GSM for obtaining optimal or sub-optimal solutions. Depending on the output of SSM 1310, either PC-IPAM 1312 or WF-IPAM 1314 may be invoked.

For a BRM problem, PC-IPAM 1312 efficiently obtains an initial power and/or bit allocation close to an optimal bit loading solution. The procedure takes advantage of the fact that the scenario (or condition) is essentially PSD-constrained. In ADSL systems, a total power constraint may include the power transmitted by a "nominal" PSD, which refers to the PSD constraint lowered by the amount of approximately 2.5 dB.

To devise an efficient PC-IPAM 1312, information related to a system's modulation may be incorporated into the bit loading algorithm of an embodiment of the present invention. For example, in ADSL systems, the QAM scheme may be adopted for modulation (or other purpose). IPAM may incorporate a built-in table (or other reference) of power $e_n(b_n)$ based on QAM (or other schemes). FIG. 14 illustrates a table of number of bits and power levels for incorporation into the bit loading algorithm, according to an embodiment of the present invention. Other variations or types of references may be used. In particular, the table of FIG. 14 illustrates the relation between the number of data bits and the power level for supporting the number of data bits in an ADSL modem compliant to ITU G.992.1 standard (or other standard). Based on this table (or other similar reference), IPAM may determine an initial bit and power allocation.

Figure 15:
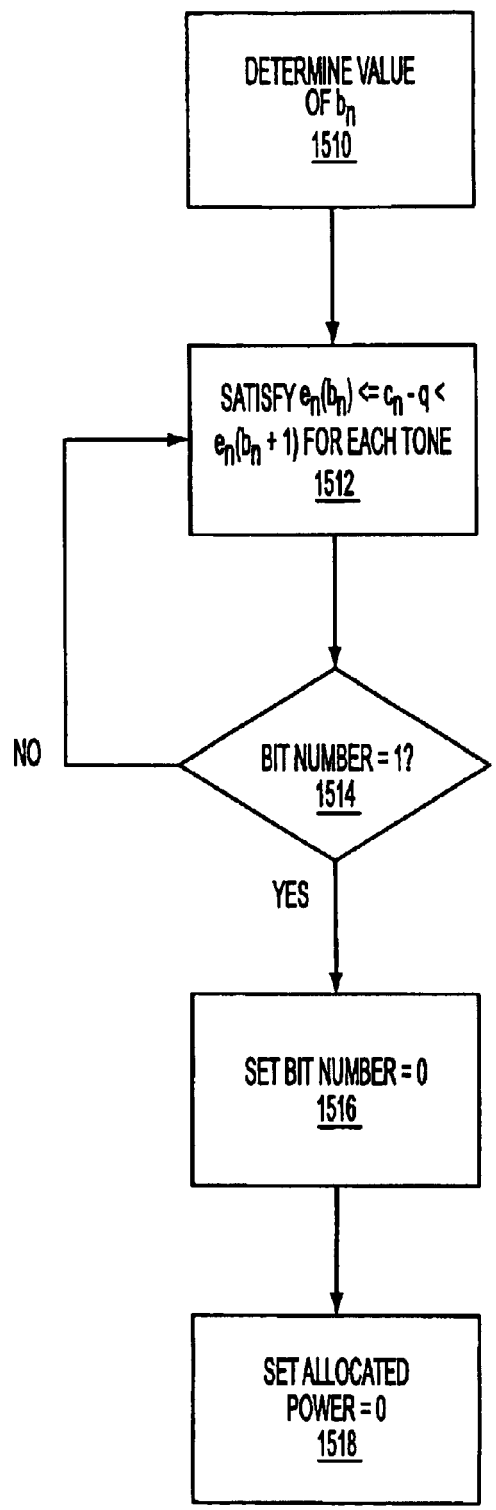
FIG. 15 is a flowchart illustrating PC-IPAM, according to an embodiment of the present invention.

FIG. 15 is a flowchart illustrating PC-IPAM, according to an embodiment of the present invention. The steps of FIG. 15 may be designed for ADSL modems. At step 1510, a value of $b_n$ may be determined. The value of $b_n$ may be selected such that $e_n(b_n) \leq c_n - q < e_n(b_n+1)$ for each tone, where $c_n$ is the PSD constraint, $b_n$ is the bit allocation, $e_n(b_n)$ is the power allocation, and q is an adjustment factor, as determined at step 1512. At step 1514, if a bit number at some tones equals 1, then the bit number at that tone may be set to 0, at step 1516 and the allocated power may be set to 0, at step 1518 because G.992.1 does not allow 1 bit to be loaded. The resulting bit and power allocation may be referred to as an initial bit and power allocation. Depending on other conditions and constraints, other values may be assigned to the variables.

The adjustment factor q, if chosen properly, is highly effective in enabling the initial power and bit allocation to represent an optimal solution, thereby reducing computational costs at GSM. For example, a value corresponding to 1.5 dB decrease is a reasonable choice. However, for additional effectiveness, the value for the adjustment factor should be chosen based on conditions, such as a transmission condition. For example, if the transmission condition is such that many tones are usable on the condition that they are allocated with a power level greater the nominal PSD, then q may be reduced.

Figure 16:
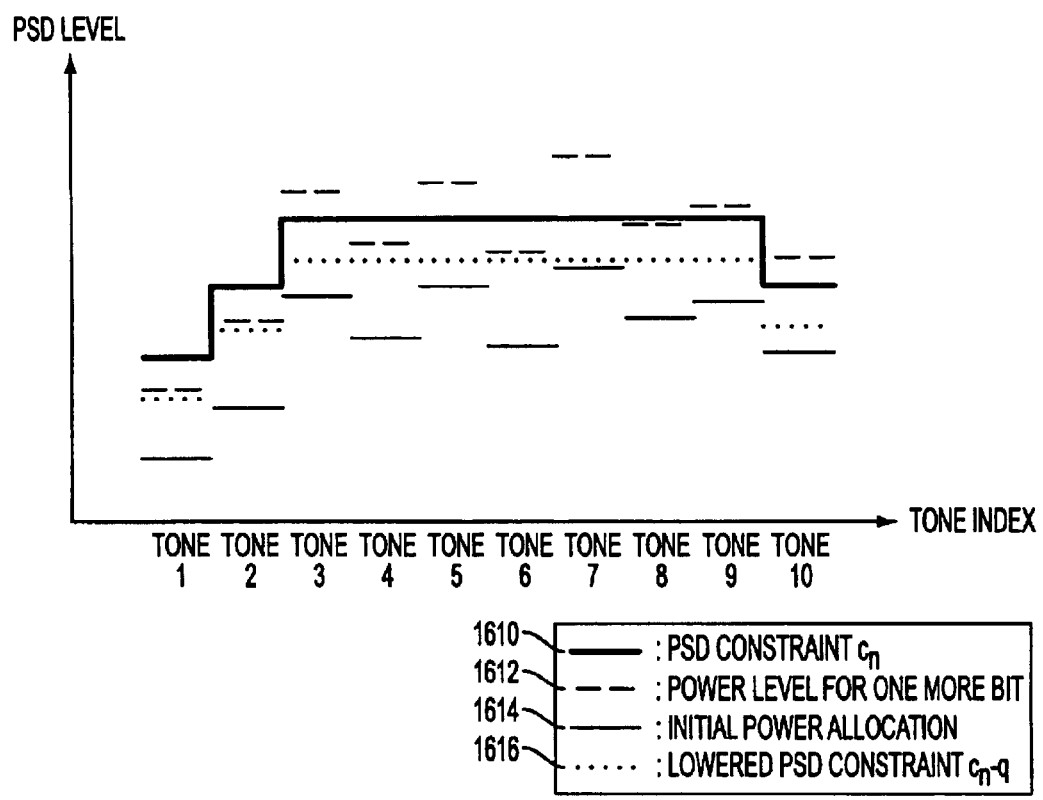
FIG. 16 illustrates an example of an output of PC-IPAM, according to an embodiment of the present invention.

FIG. 16 illustrates an example of an output of PC-IPAM 1312, according to an embodiment of the present invention. There are 10 tones in this example. The thick solid line 1610 represents PSD constraint $c_n$. The dotted line 1616 represents a power level $c_n-q$. The thin solid line 1614 represents an initial power allocation $e_n(b_n)$ and the dashed line 1612 represents a power level to support one more bit, e.g., $e_n(b_n+1)$. The inequality $$e_n(b_n) \leq c_n - q < e_n(b_n+1)$$

holds for all n=1 to 10. As shown in FIG. 16, several tones may be loaded with one more bit without violating the PSD constraint. For example, tone 1 and 2 are examples of such tones. Also, there are tones where no more bits can be loaded without violating the PSD constraint. Tone 3 and 5 are examples of such tones. Whether to load more bits may depend on the amount of the total power budget remaining. This decision as well as choosing which tones to load more bits may be handled in the next procedure, GSM, as discussed in detail below.

For a MM scenario, the computational cost to obtain optimal solutions may be considered formidable. The bit loading algorithm of an embodiment of the present invention incorporates a combination of WF-IPAM 1314 and WF-GSM 1318 to provide sub-optimal solutions which are close to the optimal solutions at low costs and effort. The name "Water-Filling" refers to a procedure of calculating optimal transmitting PSDs for general communication systems. WF-IPAM 1314 generates water-filling solutions and then truncates the solutions to meet various requirements and/or conditions associated with DMT systems, e.g., ADSL modems. The resulting solutions of an embodiment of the present invention are close to optimal solutions, also known as sub-optimal solutions.

Figure 17:
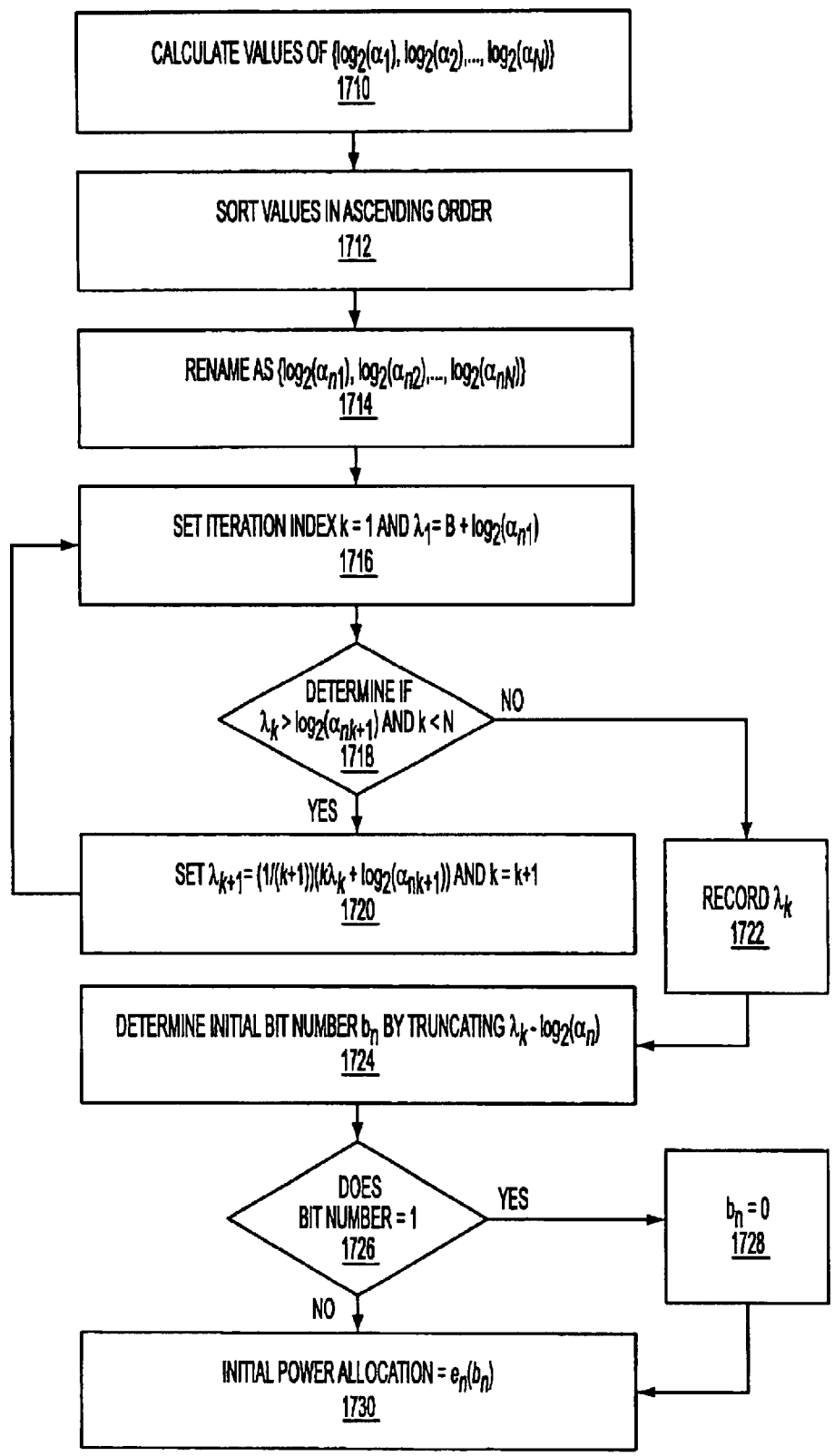
FIG. 17 is a flowchart illustrating WF-IPAM, according to an embodiment of the present invention.

FIG. 17 is a flowchart illustrating WF-IPAM, according to an embodiment of the present invention. The procedure of FIG. 17 may be designed for ADSL modems, for example. At step 1710, the values of $\{\log_2(\alpha_1), \log_2(\alpha_2), \ldots, \log_2(\alpha_N)\}$ may be calculated. At step 1712, these calculated values may be sorted in an order, such as in ascending order. At step 1714, the sorted values may be renamed as $\{\log_2(\alpha_{n1}), \log_2(\alpha_{n2}), \ldots, \log_2(\alpha_{nN})\}$. At step 1716, a water-filling procedure may be initiated by setting an iteration index k=1 and $\lambda_1 = B + \log_2(\alpha_{n1})$. At step 1718, it may be determined whether $\lambda_k > \log_2(\alpha_{nk+1})$ and k<N are satisfied. If so, at step 1720, the equation $\lambda_{k+1} = (1/(k+1))(k\lambda_k + \log_2(\alpha_{nk+1}))$ is set where k is increased by a predetermined value, such as 1. Step 1716 is then repeated. Otherwise, the value of $\lambda_k$ is recorded at step 1722. At step 1724, the initial bit number $b_n$ may be determined by truncating the value of $\lambda_{k-\log_2}(\alpha_n)$ to an integer. If it is determined that the value of the bit number is 1, at step 1726, then $b_n$ is set to a predetermined value, such as 0, at step 1728. The initial power allocation may be calculated as $e_n(b_n)$, at step 1730.

There may be instances where the initial bit allocation does not achieve the aggregate data rate. In other words, the summation of $b_n$ may be less than B. Therefore, WF-GSM provides a fine tuning function for the truncated water-filling solution. The details of WF-GSM are discussed below.

GSM functionality fine tunes the initial power and bit allocation. Depending on the output of SSM 1310, PC-GSM 1316 or WF-GSM 1318 may be implemented. Other options may also be available. PC-GSM 1316 produces optimal bit loading solutions, while WF-GSM 1318 produces sub-optimal solutions, in response to the particular conditions and/or other factors.

Figure 18:
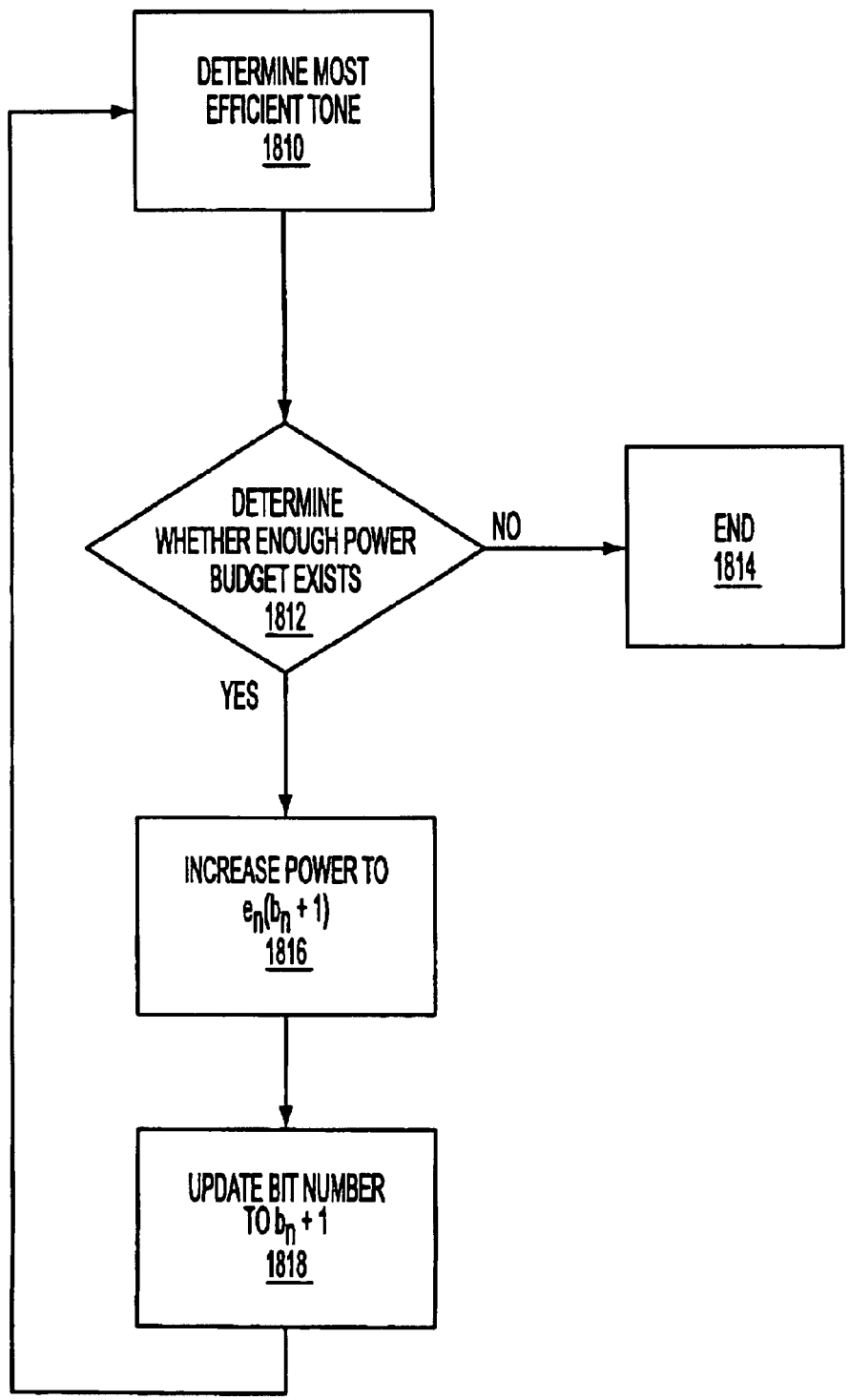
FIG. 18 is a flowchart illustrating PC-GSM, according to an embodiment of the present invention.

FIG. 18 is a flowchart illustrating PC-GSM, according to an embodiment of the present invention. In particular, FIG. 18 illustrates the steps involved in PC-GSM 1316. At step 1810, an efficient tone may be determined. This may involve determining which tone has the smallest (or a small enough) $\Delta e_n(b_n+1)$ and whether the tone is permissible as determined by an increased power level not exceeding the PSD constraint $c_n$ and the number of bits not exceeding a predetermined value. Other constraints may be taken into consideration. At step 1812, whether enough power budget is left for the tone may be determined. If so, the power at that tone may be increased to $e_n(b_n+1)$ at step 1816. At step 1818, the bit number may be updated to $(b_n+1)$. These steps may be repeated until no other bits can be added without exceeding the aggregate power budget or until permissible tones are unavailable, at which point the process is terminated at step 1814.

The procedure as used in ADSL modems, for example, may be further optimized by taking into account special requirements and/or conditions associated with ADSL. When choosing an efficient and permissible tone, $\Delta e_n(b_n+1)$ may be used for tones whose initial $b_n$ is larger than 1, and $(½)\Delta e_n(2)$ for tones whose initial $b_n$ is 0. If a tone with initial $b_n=0$ is chosen, power allocation for that tone may be increased from 0 to $e_n(2)$ and the bit number from 0 to 2.

Figure 19:
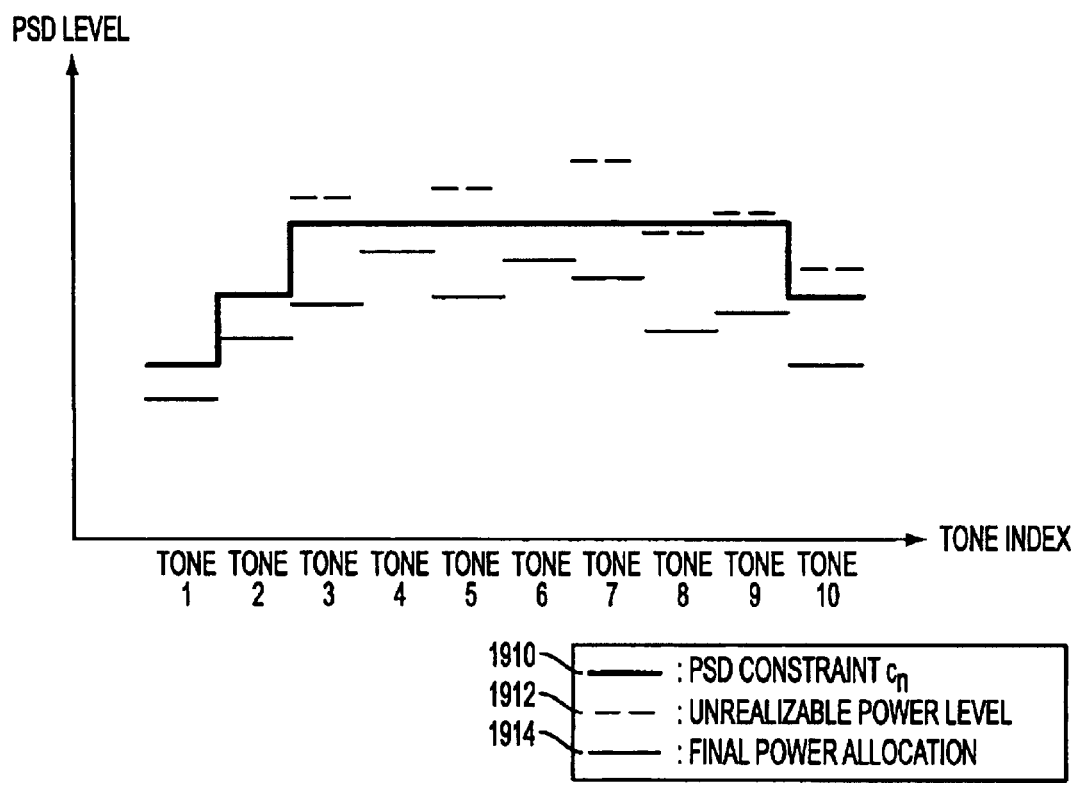
FIG. 19 illustrates an example of an output of GSM, according to an embodiment of the present invention.

FIG. 19 illustrates an example of an output of PC-GSM 1316, according to an embodiment of the present invention. In response to an input received from PC-IPAM 1312, PC-GSM 1316 may choose tones 1, 2, 4, and 6 to increase the allocated power and bit number, as shown in FIG. 19. Even though tone 8 may be loaded one more bit without violating the PSD constraint, it is not chosen because the remaining power budget is not enough to support an additional bit.

WF-GSM 1318 follows the steps as illustrated in FIG. 18, according to an embodiment of the present invention. The steps discussed above in connection with FIG. 18 may be repeated until the aggregate data rate requirement is met, the remained power budget is not enough, or permissible tones are unavailable. For ADSL modems, WF-GSM 1318 may be modified in a similar manner as PC-GSM 1316 may be optimized for ADSL. Other modifications may be made for other types of modems and/or systems.

The computational complexity of the PC-IPAM 1312 and PC-GSM 1316 is approximately kN where N represents a number of tones involved and k represents an integer, usually around 20 to 30 when N=256, for example.

According to an embodiment of the present invention, an algorithm for efficient bit loading for discrete multitone systems, comprises the steps of determining a bit loading scenario for obtaining an optimized data rate allocation; generating an initial power and a bit allocation based on the bit loading scenario; and fine tuning the initial power and the bit allocation based on the bit loading scenario.

In accordance with other aspects of this exemplary embodiment, the bit loading scenario comprises at least a bit-rate maximization scenario and a margin maximization scenario; the bit-rate maximization scenario involves maximizing an aggregate data rate where a total power is less than or equal to an aggregate power budget and power at each tone is less or equal to a power spectral density constraint; the margin maximization scenario involves minimizing total power to support data rate where an aggregate data rate is given; the step of determining a bit loading scenario further comprises obtaining data related to transmission condition; the step of determining a bit loading scenario further comprises calculating a tone condition indicator which reflects condition on a particular tone; and the step of generating an initial power and a bit allocation further comprises the step of accessing a table illustrating a relation between a number of data bits and a power level to support the number of data bits for reducing computation time, wherein the bit loading scenario is bit-rate maximization scenario.

In its Hadrian™ and Antoninus™ products, Globespan Virata Corporation extends the benefits of an integrated full-rate ADSL CPE chipset. The inventive concepts discussed above may be incorporated into an integrated ADSL CPE processor and Analog Front End/Line Driver (AFE/LD) chipset, such as GlobespanVirata Corporation's Hadrian™ and Antoninus™, which may be used in a wide variety of applications. According to one embodiment of the present invention, the inventive concepts related to analog to digital converters and bit loading functionality may be incorporated into the Hadrian™ and/or Antoninus™ products.

Figure 20A:
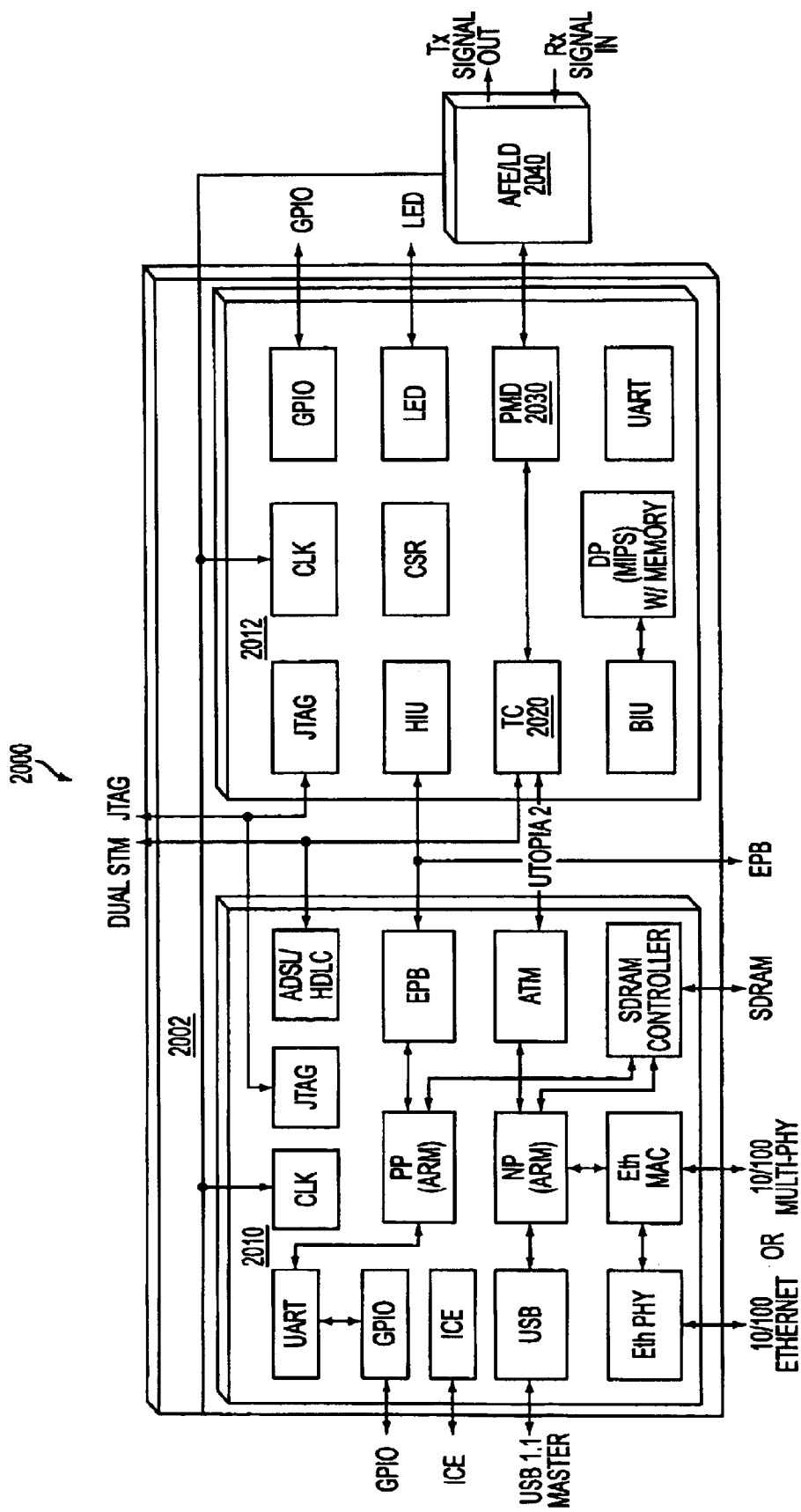
FIGS. 20a and 20b are schematic diagrams of hardware architectures in which the inventive aspects of the present invention may be incorporated.
Figure 20B:
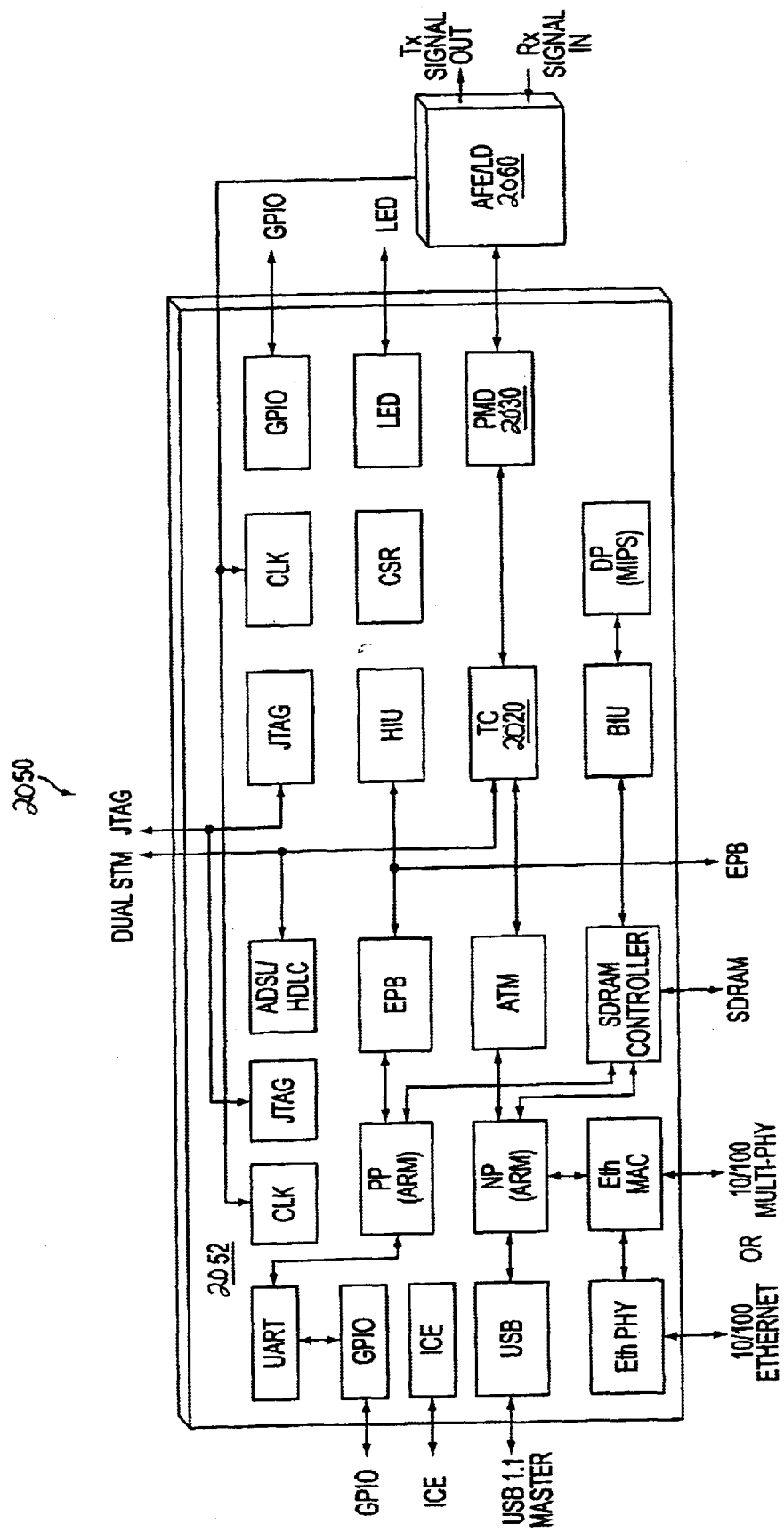

FIGS. 20*a* and 20*b* are schematic diagrams of hardware architectures in which the inventive aspects of the present invention may be incorporated. FIG. 20*a* illustrates a block diagram of a chip architecture 2000 for Hadrian 1, which includes an integrated ADSL CPE processor 2002 and AFE/LD chipset 2040. The integrated ADSL CPE processor 2002 may be delivered as a multi-chip module (MCM) including Z3 chip 2012 and Domitian Chip 2010. Z3 chip 2012 is full-rate ADSL Physical Layer (PHY) for CPE with on-chip DP (e.g., DSL PHY Processor) code storage memory. Domitian chip 2010 is a high performance communications processor for CPE with Ethernet PHY. Hadrian AFE/LD 2040 is an AFE with integrated line driver for full-rate ADSL CPE, as a part of the chip-set. The Hadrian AFE/LD 2040 is an integral part of the complete solution. The Hadrian Integrated ADSL CPE Processor 2002 is compatible with the Hadrian AFE/LD 2040.

The Hadrian-1 chipset, as shown in FIG. 20*a*, is designed to be fully compliant with the full-rate ADSL ITU standard G.992.1 (G.dmt) and the splitterless ADSL ITU standard G.992.2 (G.lite). Hadrian-i fully supports Annex A, both Frequency Division Duplex (FDD) and Echo Cancelled (EC) modes, and Annex B of G.992.1 and Annex A and B of G.992.2. In addition, the initialization procedure is fully compliant with G.994.1 (Rev. 2) (G.hs.bis). Other features may include being fully compliant with the splitterless ADSL ITU standard G.992.2 (G.lite) and supporting both Annex A and B. Hadrian 1 may also include a communications processor with Protocol Processor (PP) for protocol execution and Network Processor (NP) for data manipulation. Other features may include DSL PHY Processor (DP) for implementing modem firmware; Internal 10/100 Ethernet PHY (disabled when Media Independent Interface (MIT) interface is used); 10/100 Ethernet MAC with MII for connecting to either internal 10/100 Ethernet PHY or external 10/100 multi-PHY; External Peripheral Bus (EPB); Synchronous Transfer Mode (STM): Serial frame data (e.g., High-Level Data Link Control (HDLC)); simultaneous STM and ATM support; bearer channels AS0, AS1, LS0, LS1 for both STM and ATM; single and dual latency paths for both downstream and upstream; four framing modes, e.g., modes 0, 1, 2, and 3; Network Timing Reference (NTR) transport support; dying gasp detection and handling; Universal Serial Bus (USB) 1.1 slave; integrated line driver and Voltage Controlled Crystal Oscillator (VCXO) for the AFE; general purpose input/output (GPIO); universal asynchronous receiver/transmitter (UART); In-Circuit Emulator (ICE); and/or Joint Test Action Group (JTAG).

In particular, standard compliance includes the power spectral density (PSD) of the transmit signals for all supported annex and corresponding modes; the use of frequency bins for transmit and receive signal including pilot bins; handshake procedure as specified in G.994.1; various initialization, training, and message signals; state machine and timing sequence; DMT modulation; framing modes; bearer channels and dual latency paths; Embedded Overhead Control (EOC) channel; ADSL Overhead Control (AOC) Channel; forward error correction; inter-leaver operation; and ATM and STM functionalities. Hadrian-1 is interoperable with standard compliant central office (CO) equipment, including various DSL Access Multiplexor (DSLAM) vendors.

FIG. 20*b* illustrates Hadrian 2, which includes an integrated ADSL CPE Processor 2052 and AFE/LD 2060 chipset, as shown by 2050. Hadrian 2 ADSL CPE processor 2052 may be delivered as a single-chip and cost-optimized device, which includes Z3 chip and Domitian chip. Z3 chip is a full-rate ADSL PHY for CPE without on-chip DP code storage memory. Domitian chip is a communications processor for CPE with Ethernet PHY and with SDRAM interface capable of handling various processors, such as Network Processor (NP), Protocol Processor (PP) and DSL PHY Processor (DP). Hadrian AFE/LD 2060 is an AFE with integrated line driver for full-rate ADSL PHY for CPE and will also be included as part of a chip-set. Hadrian 2 may support the above listed features for Hadrian 1 in addition to STM: TDM H.110, ST-Bus.

The Domitian communications processor has been architected around the principle that there are two functions of a communications system which may use different architectures. These two functions are data manipulation and protocol execution.

Data manipulation involves many word, byte and bit changes on small amounts of data. These operations have a deterministic character and are finished in a short time span. The code controlling these operations are small and compact, often written in assembly language, and involves a detailed knowledge of low level data protocols (Open Source Initiative (OSI) layer 1 to layer 3) and the available hardware. Data is processed in cells and packets of limited size.

The protocol stack routines are multitasking, involving a large amount of memory and although time limits are set, these are not as strict as for the low level data manipulation routines. The data consists of frames which can be large (e.g., up to 64K).

The Domitian architecture reflects these two types of function. The Protocol Processor (PP) has a 4 KB cache and is thus suited for running large programs. It has no direct access to the network data port but can exchange data with the Network Processor (NP) using shared Synchronous Dynamic Random-Access Memory (SDRAM). Large frames of data may be easily exchanged between the two processors using this method. The main PP tasks are to set up and close connections, get data from the NP, convert the data from one protocol type to another and pass them back to the NP again to be transferred to another network interface. For protocol support, it may also generate its own data frames for signalling, operating and maintenance. The PP may also communicate with, and control external hardware using the External Peripheral Bus (EPB).

The Network Processor (NP) has a dedicated local program memory (e.g., 16 KB of SRAM) and may directly interact with network ports and associated hardware. A main tasks involves assembling incoming packets into frames for each of the network connections. It knows the status of each network port and responds to any incoming packet/cell in time to prevent buffer overflow. While receiving packets/cells, it assembles them into frames, keeps track of errors, gathers statistical data, performs policing, extraction of Operation, Administration and Maintenance (OAM) cells, etc. When transmitting data, it segments frames into packets/cells, transmits at a specified rate by inserting idle cells, adds Cyclic Redundancy Check (CRC) bytes, inserts OAM cells, etc.

Figure 21:
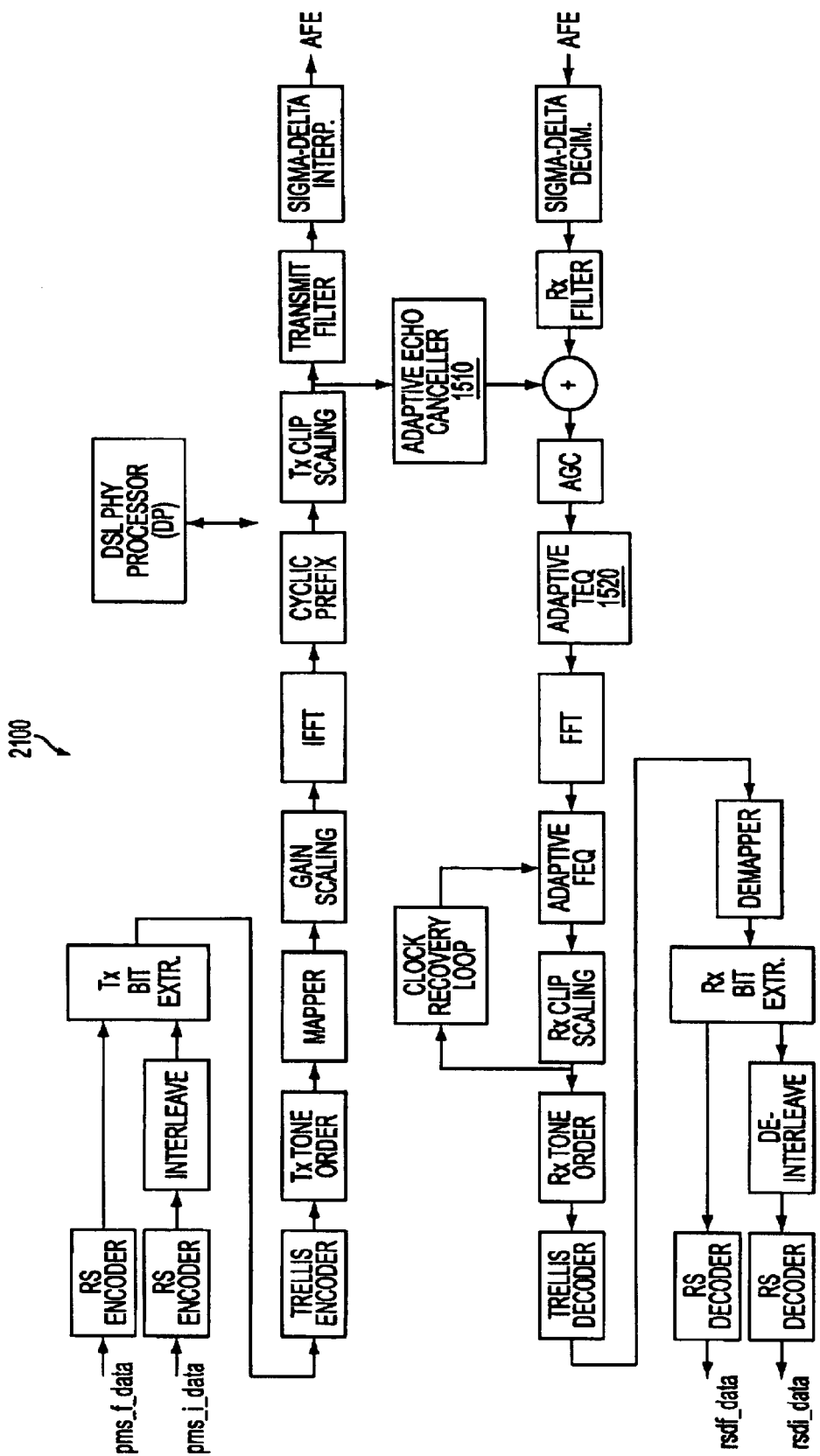
FIG. 21 is a block diagram of a physical media dependent layer of a ADSL CPE chip in which the inventive aspects of the present invention may be incorporated.

FIG. 21 is a block diagram of a physical media dependent (PMD) layer 2100 of a ADSL CPE chip in which the inventive aspects of the present invention may be incorporated. FIG. 21 illustrates core building blocks for the PMD layer and basic signal flow. As shown in FIGS. 20a and 20b, PMD 2030 is implemented in ADSL CPE Processor 2002 and 2052.

PMD layer may include a variety of functions, which may include a DSL PHY Processor (DP) for implementing modem firmware; a complete DMT engine including IFFT (e.g., 64-point, 128-point or multiples thereof) on the transmit path and a point Fast Fourier Transform (FFT) (e.g., 512-point) on the receive path, Tx/Rx Bit Extract, Cyclic Prefix, and Constellation encoder/decoder; a Forward Error Correction (FEC) mechanism including the mandatory Reed Solomon (RS) encoder/decoder and optional Trellis encoder/decoder; both fast and interleaved paths are supported along with the Interleaver/deinterleaver; Training Signals Generator and Sync Symbol Generator; Course/Fine Gain Scaling and Tx/Rx Clip Scaling; Programmable Transmit Filter and Receive Noise Reduction Filter; Digital Automatic Gain Control (AGC); Adaptive Time domain Equalization (TEQ); Adaptive Frequency domain Equalization (FEQ); Tone ordering and Bit Swap; Clock Recovery Loop (CRL); Sigma-Delta Interpolator and Decimator for Digital to Analog Converter (DAC) and Analog to Digital Converter (ADC); and Adaptive Echo Cancellation Filter.

Figure 22:
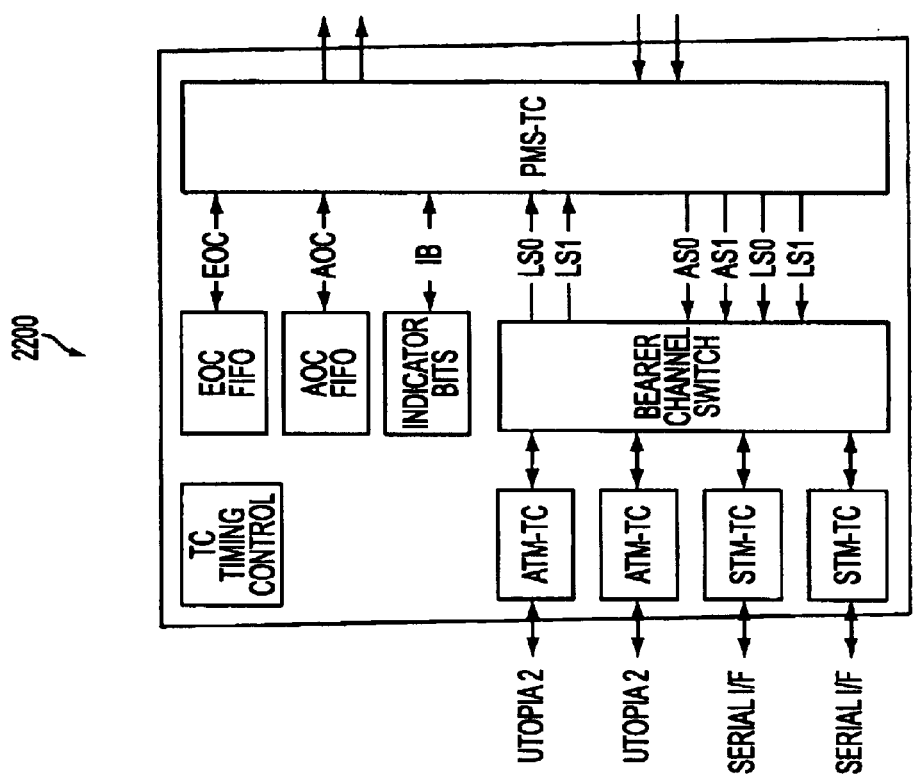
FIG. 22 is a block diagram of a transmission convergence layer of a ADSL CPE chip in which the inventive aspects of the present invention may be incorporated.

FIG. 22 is a block diagram of a transmission convergence (TC) layer 2200 of a ADSL CPE chip in which the inventive aspects of the present invention may be incorporated. As shown in FIGS. 20a and 20b, TC 2020 is implemented in ADSL CPE Processor 2002 and 2052. The TC layer may support a variety of features, such as ATM-TC; STM-TC; dual-bearer; simultaneous ATM and STM transport; Bearer Channel Switch; UTOPIA 2 interface; ADSL Overhead Control/Embedded Overhead Control (AOC/EOC) Buffers; Tx/Rx CRC; and Scrambler/Descrambler.

Figure 23:
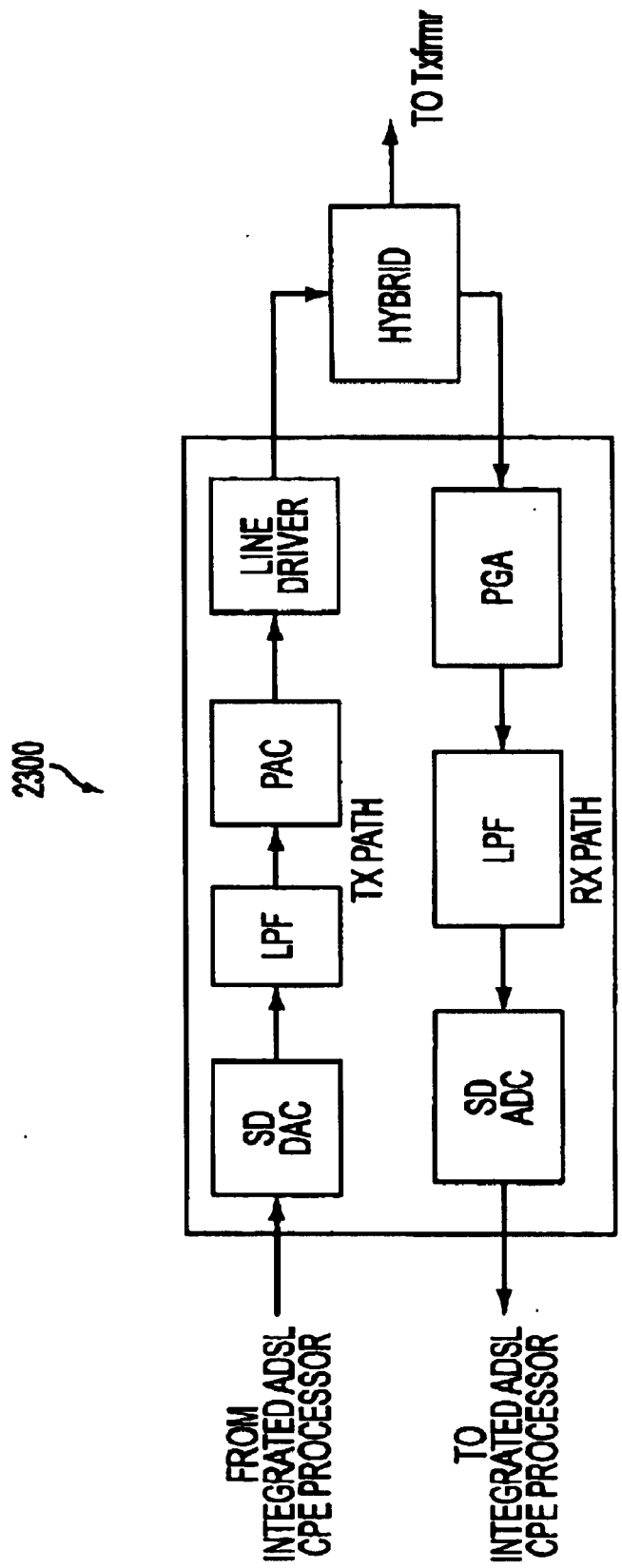
FIG. 23 is a block diagram of an analog front end device in which the inventive aspects of the present invention may be incorporated.

FIG. 23 is a block diagram of an analog front end device in which the inventive aspects of the present invention may be incorporated. Hadrian AFE/LD, as shown by 2040 and 2060 in FIGS. 20a and 20b, with integrated line driver is an integral part of the complete solution. To achieve enhanced performance the Hadrian AFE/LD and its Hadrian Integrated ADSL CPE Processor counterpart are designed with tightly coupled architecture. AFE features may include an integrated line driver; an integrated VCXO; 16-bit DAC with 14.5 effective bits; 16-bit ADC with 13.5 effective bits; industrial temperature range: −40C−−85C; and external filters.

Figure 24A:
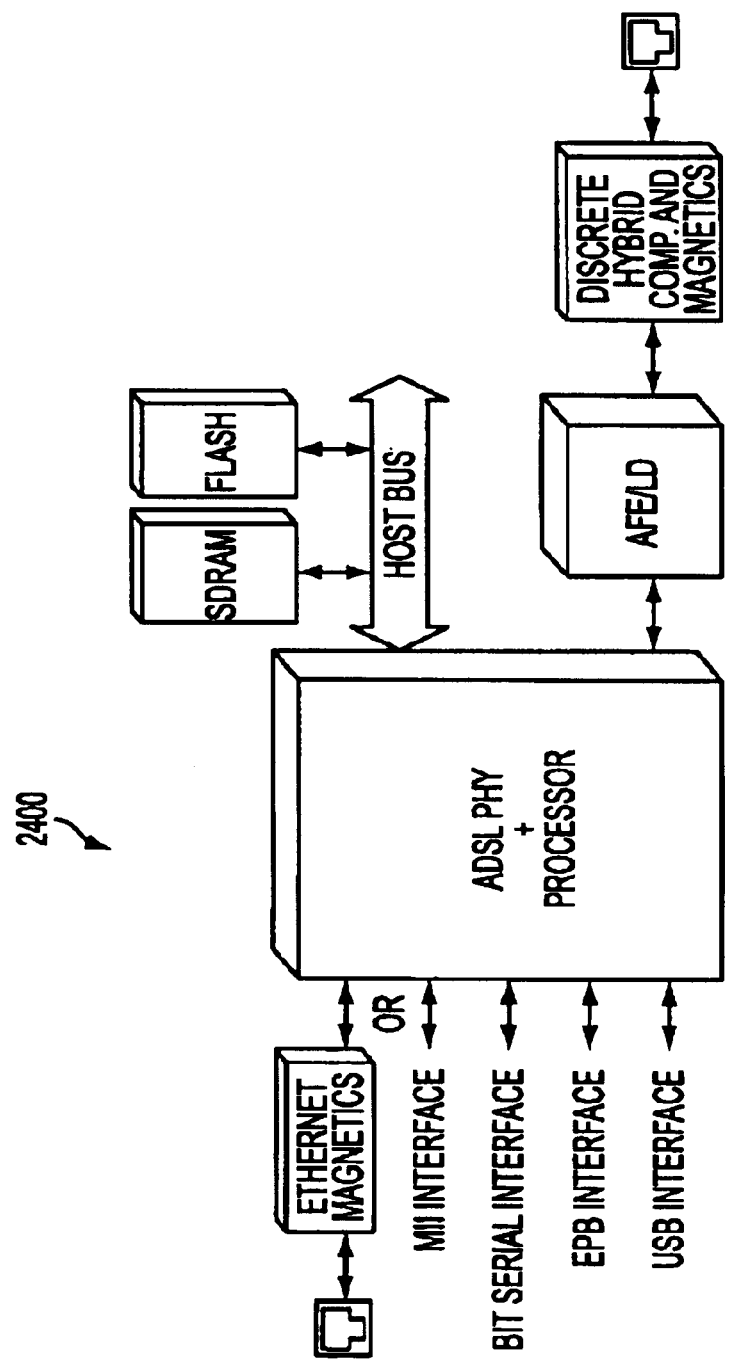
FIGS. 24a–24c are block diagrams of applications in which the inventive aspects of the present invention may be incorporated.
Figure 24B:
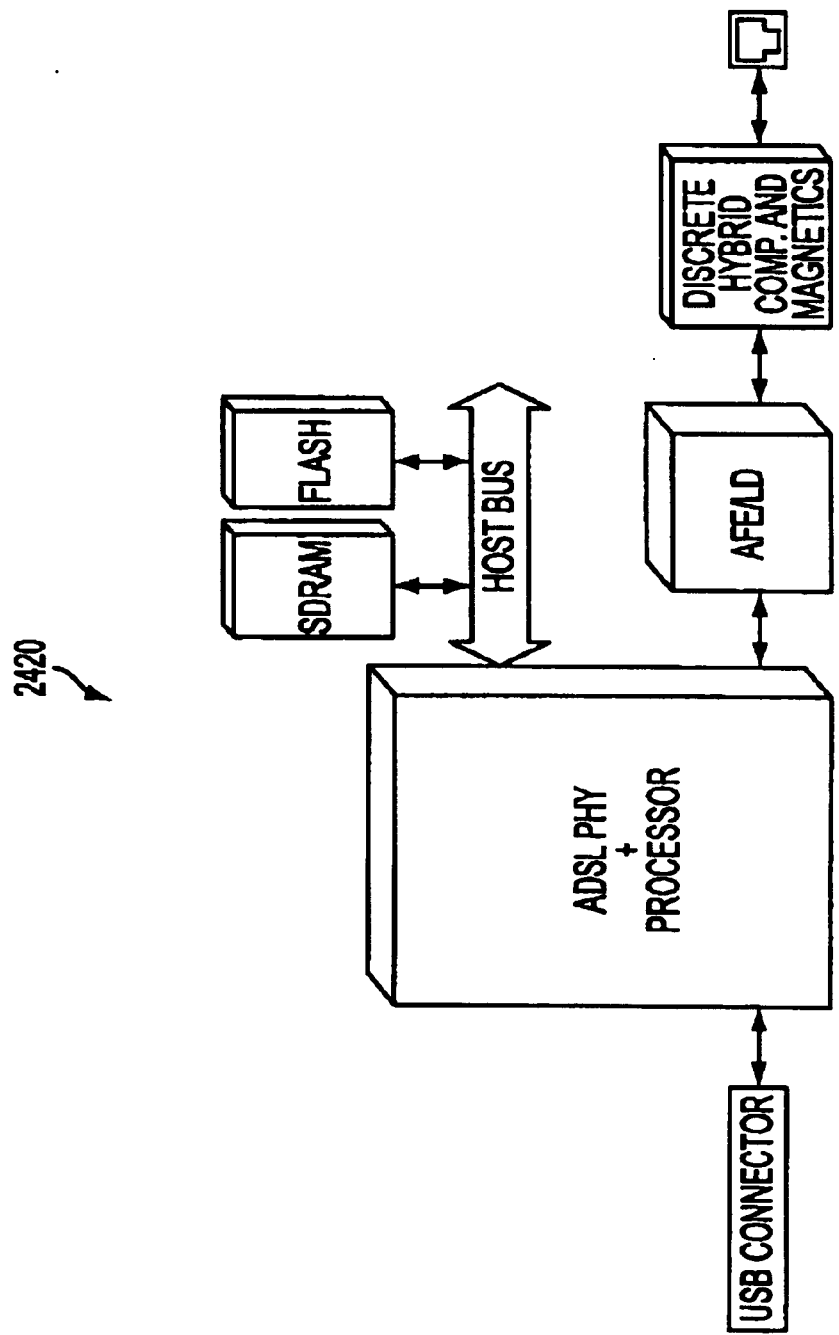
Figure 24C:
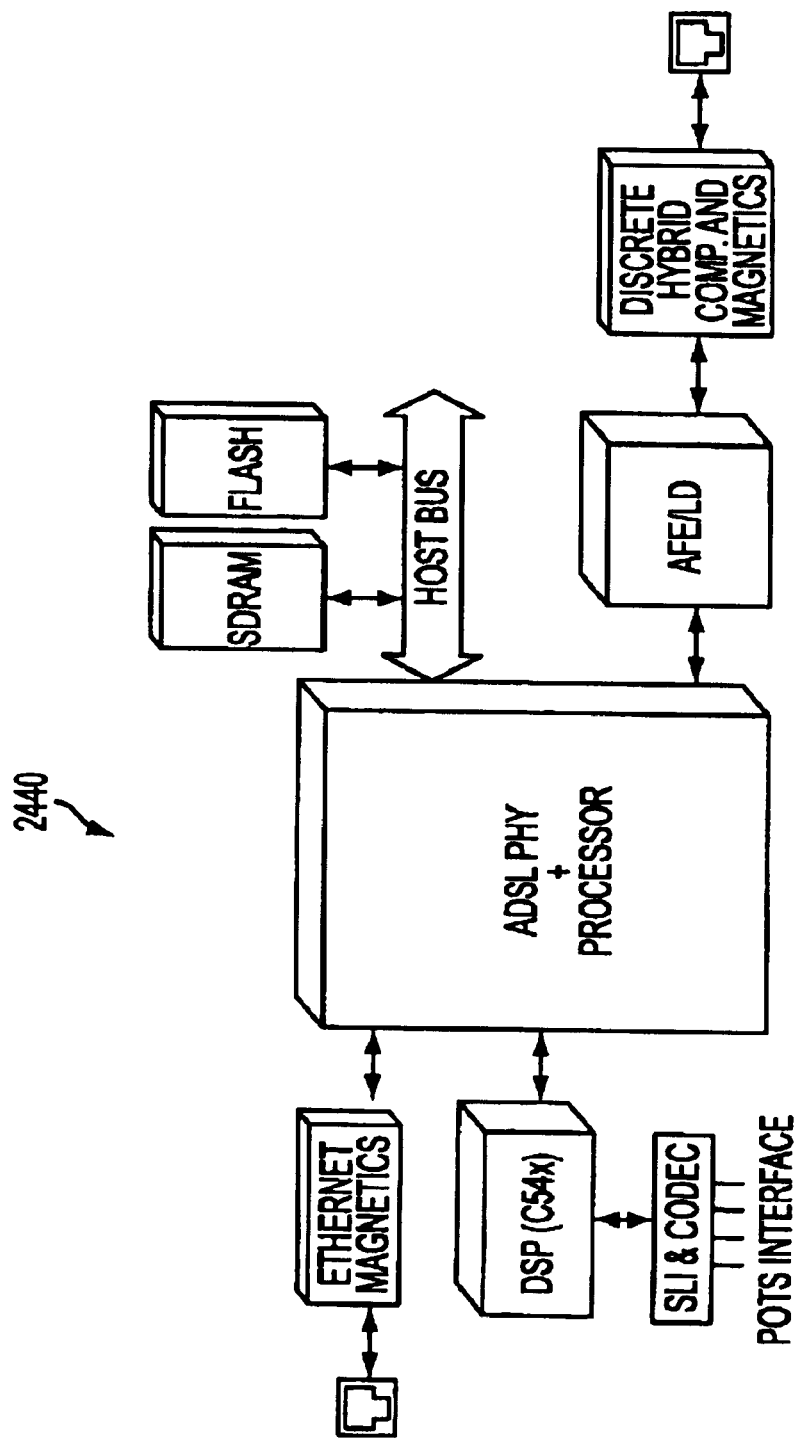

FIGS. 24a–24c are a block diagram of applications in which the inventive aspects of the present invention may be incorporated. FIG. 24a illustrates an Ethernet Router/Bridge 2400 which incorporates the Hadrian product. FIG. 24b illustrates a USB Modem and USB-Attached Gateway 2420 which incorporates the Hadrian product. FIG. 24c illustrates an Integrated Access Device (IAD) 2440 which incorporates the Hadrian product.

GlobespanVirata's Antoninus is a full-rate ADSL CPE PHY device comprised of two chips, which includes an ADSL CPE Processor called Z3 (as discussed above in connection with Hadrian 1) and a AFE/LD chipset, as illustrated in FIG. 23. The Z3 chip is a full-rate ADSL PHY for CPE with on-chip DP (e.g., DSL PHY processor) code storage memory. The ADSL CPE processor Z3 is also used in Hadrian 1, discussed above. Similarly, the inventive aspects related to the digital to analog conversion and bit loading functionality may be implemented in the Antoninus product. Antoninus AFE/LD is an AFE with integrated line driver for full-rate ADSL CPE, which is also included as part of the chip-set.

While the foregoing description includes many details and specificities, it is to be understood that these have been included for purposes of explanation only, and are not to be interpreted as limitations of the present invention. Many modifications to the embodiments described above can be made without departing from the spirit and scope of the invention.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. An analog-to-digital converter comprising:
   a polyphase combiner comprising at least a first combiner filter and a second combiner filter for receiving a plurality of inputs and generating a combined signal; and
   a multistage decimator structure for receiving the combined signal and generating a digital sigma-delta output, the multistage decimator structure comprising at least:
   a first decimator comprising a first integrator filter; a first downsampling block and a first differentiator; and
   a second decimator comprising a second integrator filter; a second downsampling block and a second differentiator.

2. The converter of claim 1, wherein the first combiner filter comprises:
   a plurality of filters for receiving a plurality of input sequences and for generating a plurality of outputs;
   an adder for summing the plurality of outputs and for generating a first sum; and
   a first filter for receiving the first sum and for generating a first filtered output.

3. The converter of claim 2, wherein the first filter comprises first filter coefficients defined as $\{f1_k; k \in \{0, \ldots, L_{F1}-1\}\}$ where $$L_{F1} = \begin{cases} \dfrac{K+1}{2} & \text{when } K \text{ is odd} \\ \dfrac{K}{2}+1 & \text{when } K \text{ is even} \end{cases}$$

and $$f1_k = \binom{n}{2k} \quad k \in \{0, \ldots, L_{F1}-1\}.$$

4. The converter of claim 2, wherein the input sequences comprises at least an even sub-sample and an odd sub-sample.

5. The converter of claim 3, wherein the second combiner filter comprises:
   a plurality of filters for receiving a plurality of input sequences and for generating a plurality of outputs;
   an adder for summing the plurality of outputs and for generating a second sum; and
   a second filter for receiving the second sum and for generating a second filtered output.

6. The converter of claim 5, wherein the second filter comprises second filter coefficients defined as $\{f2_k; k \in \{0, \ldots, L_{F2}-1\}\}$ where $$L_{F2} = \begin{cases} \dfrac{K+1}{2} & \text{when } K \text{ is odd} \\ \dfrac{K}{2} & \text{when } K \text{ is even} \end{cases}$$

and $$f2_k = \binom{n}{2k+1} \quad k \in \{0, \ldots, L_{F2}-1\}.$$

7. The converter of claim 5, wherein the input sequences comprises at least an even sub-sample and an odd sub-sample.

8. The converter of claim 5, further comprising a combiner adder for adding the first filtered output of the first filter and the second filtered output of the second filter.

9. The converter of claim 1, wherein the first integrator filter comprises a $K^{th}$ order integrator filter comprising a cascade of K integrators; the first downsampling block having a first subsampling factor; and the first differentiator comprises a $K^{th}$ order differentiator comprising a cascade of K differentiators;
   where K is an integer greater than 1.

10. The converter of claim 9, wherein the second integrator filter comprises a $K^{th}$ order integrator filter comprising a cascade of K integrators; the second downsampling block having a second subsampling factor; and the second differentiator comprises a $K^{th}$ order differentiator comprising a cascade of K differentiators;
    where K is an integer greater than 1.

11. A method for implementing an analog-to-digital converter, the method comprising the steps of:
    receiving a plurality of inputs by a first filter and a second filter;
    generating a combined signal in response to the plurality of inputs;
    receiving the combined signal;
    generating a digital sigma-delta output in response to the combined signal, wherein the digital sigma-delta output is generated by at least:
    a first decimator comprising a first integrator filter; a first downsampling block and a first differentiator; and
    a second decimator comprising a second integrator filter; a second downsampling block and a second differentiator.

12. The method of claim 11, wherein the step of generating a combined signal further comprises the steps of:
    receiving a plurality of input sequences;
    generating a plurality of outputs in response to the plurality of input sequences;
    summing the plurality of outputs for generating a first sum; and
    receiving the first sum; and
    generating a first filtered output in response to the first sum.

13. The method of claim 12, wherein the first filtered output is filtered by a first filter having first filter coefficients defined as $\{f1_k; k \in \{0, \ldots, L_{F1}-1\}\}$ where $$L_{F1} = \begin{cases} \dfrac{K+1}{2} & \text{when } K \text{ is odd} \\ \dfrac{K}{2}+1 & \text{when } K \text{ is even} \end{cases}$$

and $$fl_k = \binom{n}{2k} \quad k \in \{0, \ldots, L_{F1} - 1\}.$$

14. The method of claim 12, wherein the input sequences comprises at least an even sub-sample and an odd sub-sample.

15. The method of claim 13, wherein the step of generating a combined signal further comprises the steps of:

receiving a plurality of input sequences;

generating a plurality of outputs in response to the plurality of input sequences;

summing the plurality of outputs for generating a second sum;

receiving the second sum; and generating a second filtered output in response to the second sum.

16. The method of claim 15, wherein the second filtered output is filtered by a second filter having second filter coefficients defined as $\{f2_k; k \in \{0, \ldots, L_{F2}-1\}\}$ where $$L_{F2} = \begin{cases} \frac{K+1}{2} & \text{when } K \text{ is odd} \\ \frac{K}{2} & \text{when } K \text{ is even} \end{cases}$$

and $$f2_k = \binom{n}{2k+1} \quad k \in \{0, \ldots, L_{F2} - 1\}.$$

17. The method of claim 15, wherein the input sequences comprises at least an even sub-sample and an odd sub-sample.

18. The method of claim 15, further comprises the step of:

adding the first filtered output of the first filter and the second filtered output of the second filter.

19. The method of claim 11, wherein the first integrator filter comprises a $K^{th}$ order integrator filter comprising a cascade of K integrators; the first downsampling block having a first subsampling factor; and the first differentiator comprises a $K^{th}$ order differentiator comprising a cascade of K differentiators;

where K is an integer greater than 1.

20. The method of claim 19, wherein the second integrator filter comprises a $K^{th}$ order integrator filter comprising a cascade of K integrators; the second downsampling block having a second subsampling factor; and the second differentiator comprises a $K^{th}$ order differentiator comprising a cascade of K differentiators;

where K is an integer greater than 1.

* * * * *